(12) United States Patent
Bolotnikov et al.

(10) Patent No.: US 10,937,870 B2
(45) Date of Patent: *Mar. 2, 2021

(54) ELECTRIC FIELD SHIELDING IN SILICON CARBIDE METAL-OXIDE-SEMICONDUCTOR (MOS) DEVICE CELLS USING BODY REGION EXTENSIONS

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/789,164

(22) Filed: Feb. 12, 2020

(65) Prior Publication Data
US 2020/0258985 A1 Aug. 13, 2020

Related U.S. Application Data

(63) Continuation of application No. 15/595,643, filed on May 15, 2017, now Pat. No. 10,600,871.
(Continued)

(51) Int. Cl.
*H01L 29/16* (2006.01)
*H01L 29/66* (2006.01)
(Continued)

(52) U.S. Cl.
CPC ........ *H01L 29/1608* (2013.01); *H01L 21/046* (2013.01); *H01L 21/0465* (2013.01);
(Continued)

(58) Field of Classification Search
CPC ............ H01L 21/0465; H01L 29/1608; H01L 29/1095; H01L 29/66068; H01L 29/7816;
(Continued)

(56) References Cited

U.S. PATENT DOCUMENTS 8,212,321 B2   7/2012   Lamey et al.
8,421,148 B2   4/2013   Harris et al.
(Continued)

FOREIGN PATENT DOCUMENTS

CN   202816955 U       3/2013
DE   102004009602 B4   9/2009
DE   12014003637 T5    4/2016

OTHER PUBLICATIONS

Written Opinion of the International Searching Authority for Application No. PCT/US2017/033953 dated Nov. 30, 017.

*Primary Examiner* — Fazli Erdem
(74) *Attorney, Agent, or Firm* — Fitch, Even, Tabin & Flannery LLP

(57) ABSTRACT

The subject matter disclosed herein relates to semiconductor power devices, such as silicon carbide (SiC) power devices. In particular, the subject matter disclosed herein relates to shielding regions in the form of body region extensions for that reduce the electric field present between the well regions of neighboring device cells of a semiconductor device under reverse bias. The disclosed body region extensions have the same conductivity-type as the body region and extend outwardly from the body region and into the JFET region of a first device cell such that a distance between the body region extension and a region of a neighboring device cell having the same conductivity type is less than or equal to the parallel JFET width. The disclosed shielding regions enable superior performance relative to a conventional stripe device of comparable dimensions, while
(Continued)

still providing similar reliability (e.g., long-term, high-temperature stability at reverse bias).

20 Claims, 28 Drawing Sheets

Related U.S. Application Data

(60) Provisional application No. 62/340,396, filed on May 23, 2016.

(51) Int. Cl.

| | | |
|---|---|---|
| *H01L 29/78* | (2006.01) | |
| *H01L 21/04* | (2006.01) | |
| *H01L 29/06* | (2006.01) | |
| *H01L 29/10* | (2006.01) | |
| *H01L 29/739* | (2006.01) | |
| *H01L 29/745* | (2006.01) | |
| *H01L 29/74* | (2006.01) | |

(52) U.S. Cl.
CPC ........ *H01L 29/063* (2013.01); *H01L 29/0623* (2013.01); *H01L 29/0646* (2013.01); *H01L 29/0696* (2013.01); *H01L 29/1095* (2013.01); *H01L 29/66068* (2013.01); *H01L 29/7395* (2013.01); *H01L 29/7455* (2013.01); *H01L 29/78* (2013.01); *H01L 29/7802* (2013.01); *H01L 29/7816* (2013.01); *H01L 29/7393* (2013.01); *H01L 29/74* (2013.01)

(58) Field of Classification Search
CPC ......... H01L 21/04; H01L 29/16; H01L 29/66; H01L 29/78
USPC .......................................................... 257/77
See application file for complete search history.

(56) References Cited

U.S. PATENT DOCUMENTS

| | | |
|---|---|---|
| 8,674,440 B2 | 3/2014 | Korec |
| 10,056,457 B2 | 8/2018 | Bolotnikov et al. |
| 10,096,681 B2 | 10/2018 | Bolotnikov et al. |
| 10,600,871 B2 * | 3/2020 | Bolotnikov ............. H01L 29/78 |
| 2001/0001494 A1 | 5/2001 | Kocon |
| 2004/0099885 A1 | 5/2004 | Yeo et al. |
| 2004/0164304 A1 | 8/2004 | Magri et al. |
| 2013/0200451 A1 | 8/2013 | Yilmaz et al. |
| 2013/0313570 A1 | 11/2013 | Sdrulla et al. |
| 2014/0367771 A1 | 12/2014 | Chatty et al. |
| 2015/0053999 A1 | 2/2015 | Kumagai |
| 2016/0155836 A1 | 6/2016 | Iwamuro et al. |

* cited by examiner

ELECTRIC FIELD SHIELDING IN SILICON CARBIDE METAL-OXIDE-SEMICONDUCTOR (MOS) DEVICE CELLS USING BODY REGION EXTENSIONS

CROSS-REFERENCE TO RELATED APPLICATIONS

This application is a continuation of U.S. Non-Provisional application Ser. No. 15/595,643, entitled "ELECTRIC FIELD SHIELDING IN SILICON CARBIDE METAL-OXIDE-SEMICONDUCTOR (MOS) DEVICE CELLS USING BODY REGION EXTENSIONS," filed May 15, 2017, which claims priority from and the benefit of U.S. Provisional Application Ser. No. 62/340,396, entitled "ELECTRIC FIELD SHIELDING IN SILICON CARBIDE METAL-OXIDE-SEMICONDUCTOR (MOS) DEVICE CELLS," filed May 23, 2016, which are hereby incorporated by reference in their entirety for all purposes.

BACKGROUND

The subject matter disclosed herein relates to semiconductor power devices, such as silicon carbide (SiC) power devices, including field transistors (e.g., MOSFET, DMOSFET, UMOSFET, VMOSFET, trench MOSFET, etc.), insulated gate bipolar transistors (IGBT), and insulated base MOS-controlled thyristors (IBMCT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors).

Specifically for high-frequency, high-voltage, and/or high-current applications, silicon carbide (SiC) devices, may provide a number of advantages in terms of high temperature operation, reduced conduction and switching losses, and smaller die size than corresponding silicon (Si) devices. However, SiC also presents a number of technical and design challenges relative to Si, such as lower dopant diffusion during SiC device fabrication and higher electric fields within SiC devices during operation (e.g., under reverse bias). While the SiC portions of a SiC device may be robust to these higher electric fields, other portions of the SiC device, such as silicon oxide ($SiO_2$) dielectric layers, may fail under these higher electric fields. Accordingly, it is desirable to develop SiC device designs that reduce high electric fields to improve device reliability without substantially diminishing device performance.

BRIEF DESCRIPTION

In an embodiment, a device, includes a plurality of device cells at least partially disposed in a semiconductor device layer having a first conductivity type. Each device cell includes: a body region having a second conductivity type disposed near the center of the device cell; a source region having the first conductivity type disposed adjacent to the body region of the device cell; a channel region having the second conductivity type disposed adjacent to the source region of the device cell; and a JFET region having the first conductivity type disposed adjacent the channel region of the device cell. The JFET region has a parallel JFET width between the channel region of the device cell and a parallel portion of a channel region of a neighboring device cell of the plurality of device cells, wherein at least one device cell of the plurality of device cells comprises a body region extension having the second conductivity type that extends outwardly from the body region of the at least one device cell, through the source region of the at least one device cell, through the channel region of the at least one device cell, and into the JFET region such that a distance between the body region extension of the at least one device cell and a region of the neighboring device cell having the second conductivity type is less than or equal to the parallel JFET width.

In another embodiment, a method of manufacturing a device cell includes implanting a well region of the device cell into a semiconductor layer, wherein the well region includes a channel region of the device cell. The method includes implanting a source region of the device cell into the semiconductor layer adjacent to the well region of the device cell and implanting a body region of the device cell into the semiconductor layer adjacent to the source region of the device cell. The method also includes implanting a body region extension into the semiconductor layer that extends outwardly from the body region of the device cell, through a portion of the source region of the device cell, and though a portion of the channel region of the device cell, wherein a distance between the body region extension of the device cell and a channel region of a neighboring device cell is less than or equal to a distance between parallel portions of the channel region of the device cell and the channel region of the neighboring device cell.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be within the spirit of the present technique. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art. Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

Figure 1A:
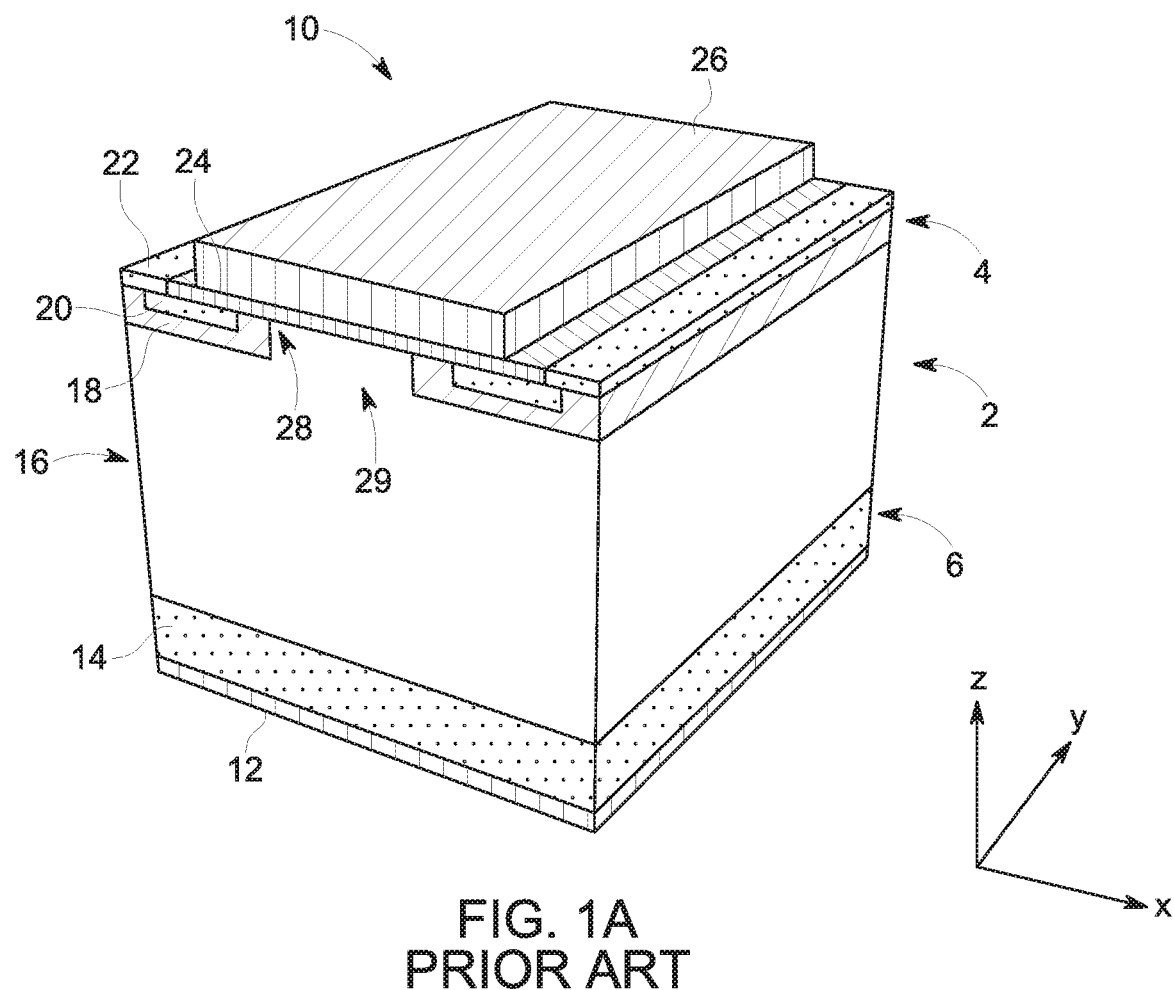
FIG. 1A is a schematic of a typical planar MOSFET device.

One of the essential building blocks of modern power electronics is the field-effect transistor (FET) device. For example, FIG. 1A illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted.

The illustrated MOSFET device 10 of FIG. 1A includes a semiconductor device layer 2 (e.g., an epitaxial SiC layer) having a first surface 4 and a second surface 6. The semiconductor device layer 2 includes a drift region 16 having a first conductivity type (e.g., an n-type drift layer 16), a well region 18 having a second conductivity type (e.g., a p-well 18) disposed adjacent to the drift region 16 and proximal to the first surface 4. The semiconductor device layer 2 also includes a source region 20 having the first conductivity type (e.g., n-type source region 20) adjacent to the well region 18 and proximal to the first surface 4. A dielectric layer 24 (also referred to as a gate insulating layer or gate dielectric layer) is disposed on a portion of the first surface 4 of the semiconductor device layer 2, and a gate electrode 26 is disposed on the dielectric layer 24. The second surface 6 of the semiconductor device layer 2 is a substrate layer 14 (e.g., a SiC substrate layer), and the drain contact 12 is disposed on the bottom of device 10 along the substrate layer 14.

During on-state operation, an appropriate gate voltage (e.g., at or beyond a threshold voltage ($V_{TH}$) of the MOSFET device 10) may cause an inversion layer to be formed in the channel region 28, as well as a conductive path to be enhanced in the junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and gate dielectric 24. Furthermore, while the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable wide band-gap semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing both n- and p-channel designs.

Figure 1B:
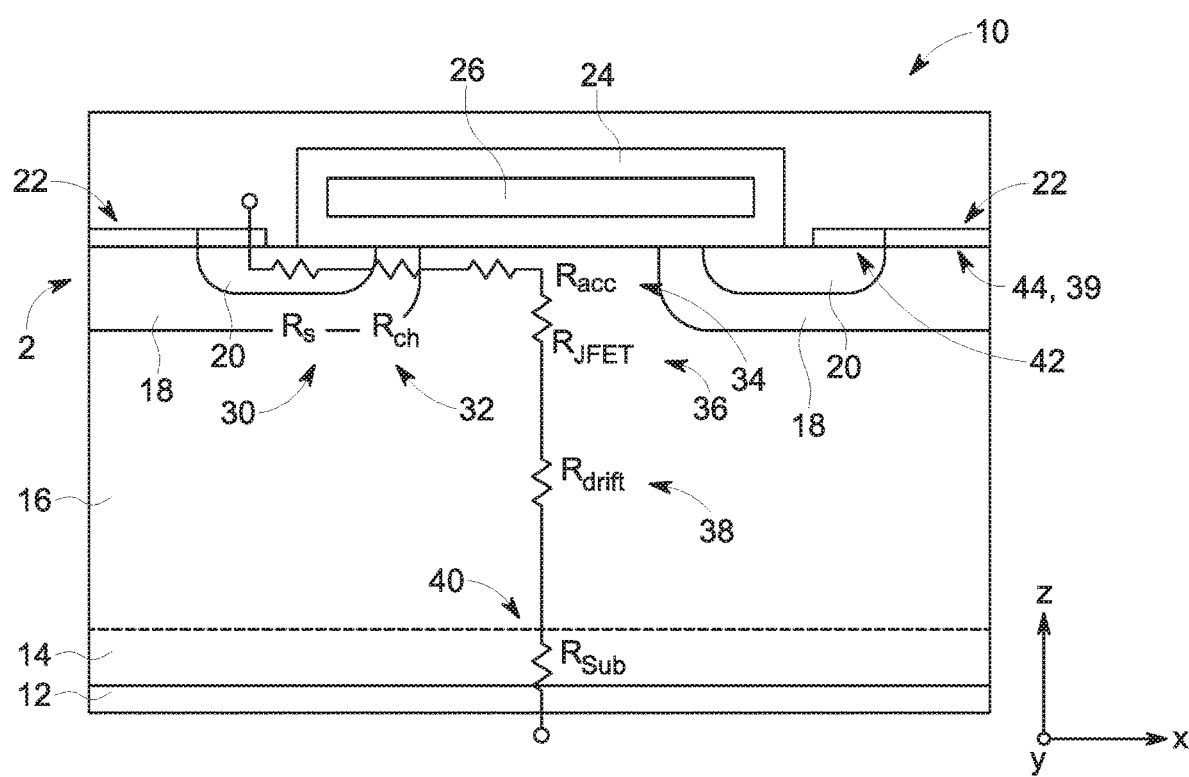
FIG. 1B is a schematic illustrating resistances for various regions of a typical MOSFET device.

FIG. 1B is a schematic cross-sectional view of the SiC device 10 of FIG. 1A. The source contacts 22 of the MOSFET device 10 illustrated in FIG. 1B generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., n+ source region 20) of the MOSFET device 10 disposed below the contact 22 may be more specifically referred to herein as a source contact region 42 of the MOSFET device 10. Similarly, a portion of the well region 18 of the MOSFET device 10, which may be doped at a higher level than the remainder of the well region 18, may be more specifically referred to herein as a body region 39 (e.g., p+ body region 39) of the MOSFET device 10. For clarity, the portion of the body region 39 that is disposed below (e.g., covered by, directly electrically connected to) the contact 22, may be more specifically referred to herein as a body contact region 44 (e.g., p+ body contact region 44) of the MOSFET device 10.

As illustrated in FIG. 1B, the various regions of the MOSFET device 10 may each have an associated resistance, and a total resistance (e.g., an on-state resistance, $R_{ds}(on)$) of the MOSFET device 10, which may be represented as a sum of each of these resistances. For example, as illustrated in FIG. 1B, on-state resistance, $R_{ds}(on)$, of the MOSFET device 10 may be approximated as a sum of: a resistance $R_s$ 30 (e.g., a resistance of source region 20 and a resistance of the contact 22); a resistance $R_{ch}$ 32 (e.g., an inversion channel resistance of the region 28 illustrated in FIG. 1A); a resistance $R_{acc}$ 34 (e.g., a resistance of an accumulation layer between the gate oxide 24 and portion of drift layer 16 located between well regions 18); a resistance $R_{JFET}$ 36 (e.g., resistance of undepleted neck region between well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 1B are not intended to be exhaustive, and that other resistances (e.g., drain contact resistance, spreading resistance, etc.) could potentially be present within the semiconductor device 10.

In certain cases, one or two resistance components illustrated in FIG. 1B may dominate conduction losses of the semiconductor device 10, and addressing these factors can significantly impact $R_{ds}(on)$. For example, for devices in which the drift resistance 38, the substrate resistance 40 and the contact resistance 30 are less significant (compared to other resistance components), such as low-voltage devices or devices suffering from low inversion layer mobility (e.g. SiC devices), the channel resistance ($R_{ch}$ 32) may account for a significant portion of device conduction losses. By further example, in medium- and high-voltage devices, JFET region resistance ($R_{JFET}$ 36) may account for a significant portion of total conduction losses.

Figure 2:
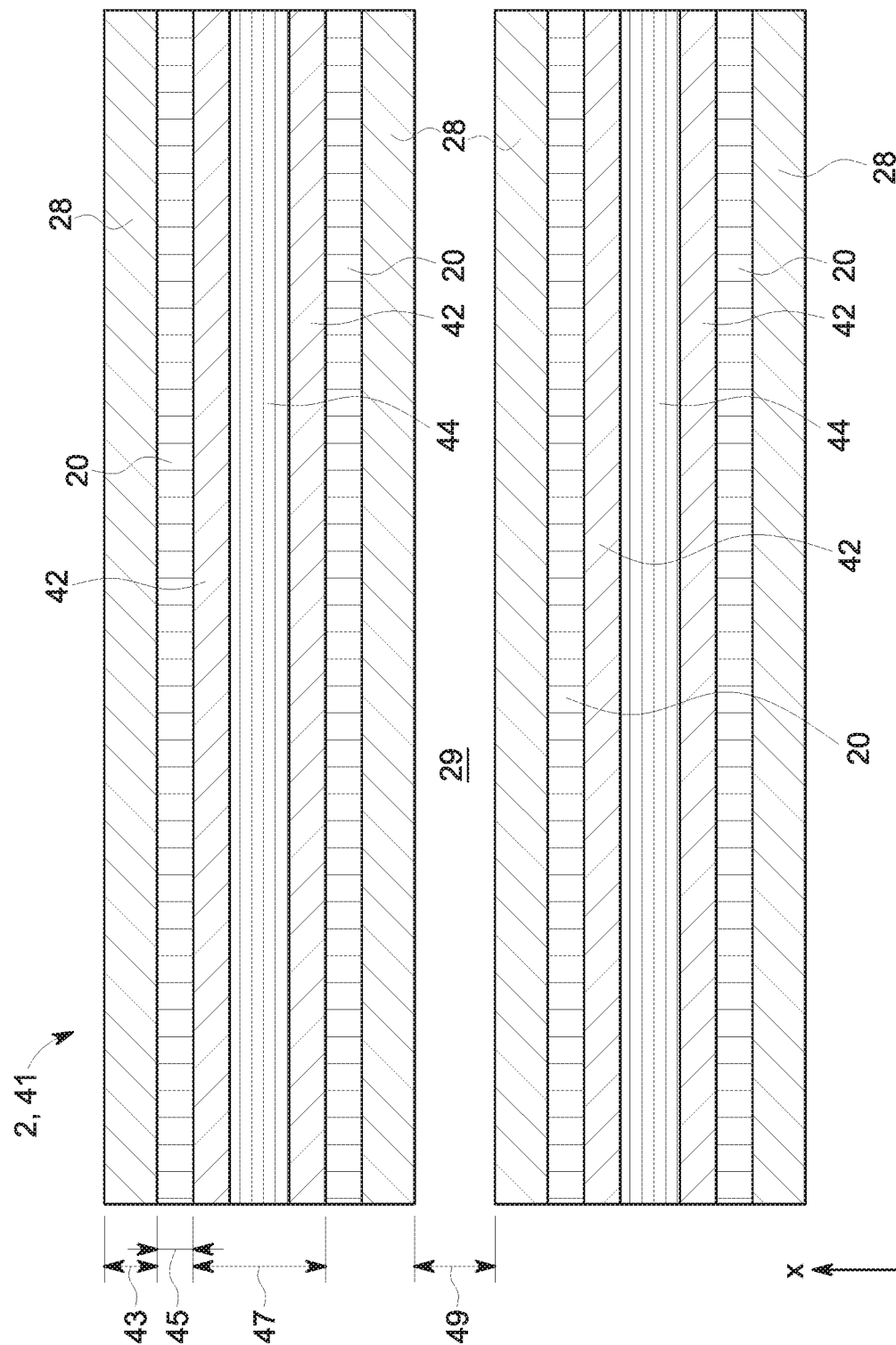
FIG. 2 is a top-down view of a surface of a SiC layer that includes a typical MOSFET device structure having a stripe cell layout.

FIG. 2 illustrates a top-down view of a semiconductor device layer 2 including a MOSFET device structure 41 having a conventional stripe cell layout. In terms of dimensions, the conventional MOSFET device structure 41 may be described as having a particular channel length ($L_{ch}$ 43), length from channel region to ohmic region ($L_{ch\_to\_ohm}$ 45), width of the ohmic region ($W_{ohm}$ 47), and width of the JFET region ($W_{JFET}$ 49). While the conventional stripe cell layout illustrated in FIG. 2 offers good reliability (e.g., long term and high temperature performance), the relatively high channel resistance ($R_{ch}$ 32) and JFET resistance ($R_{JFET}$ 36) of the MOSFET device structure 41 results in a relatively high $R_{ds}(on)$, which diminishes the electrical performance of the device.

Figure 3:
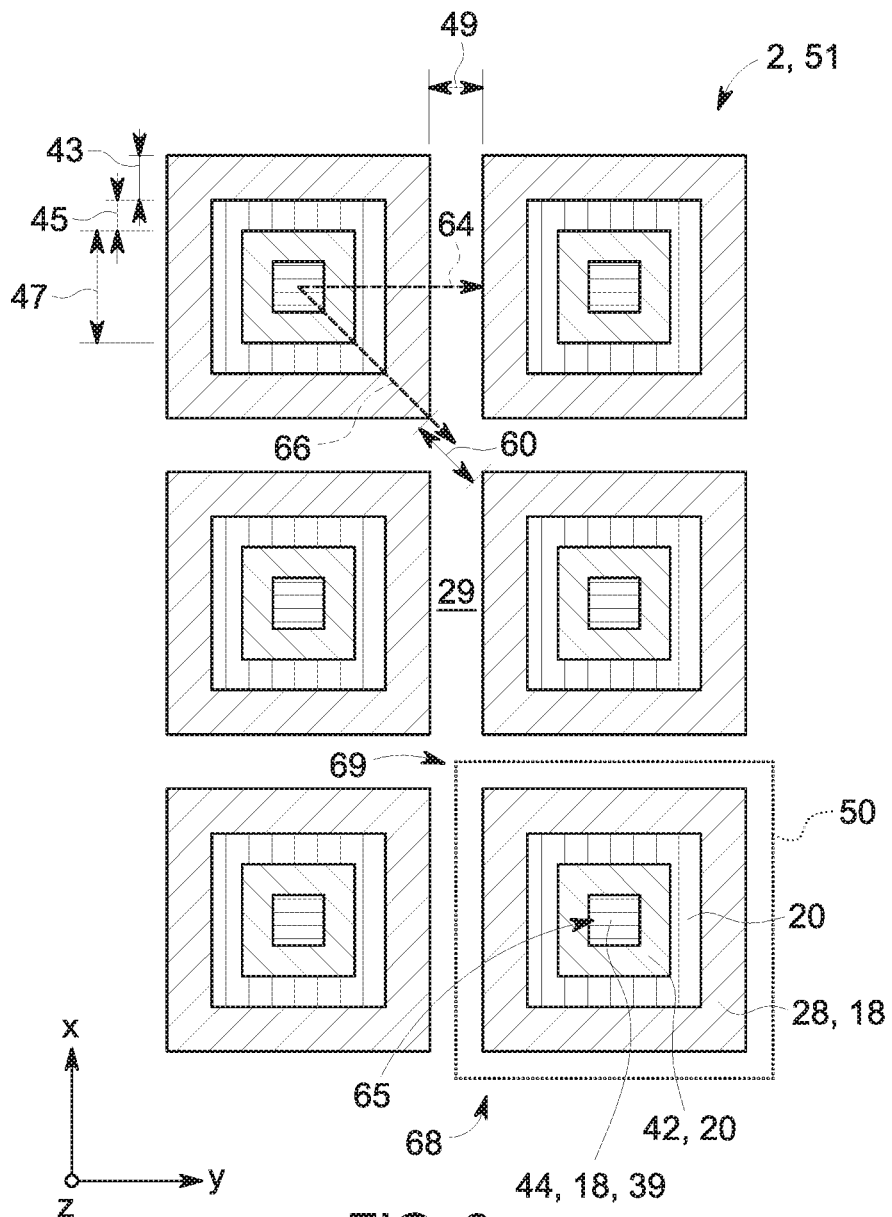
FIG. 3 is a top-down view of a SiC layer that includes a number of square semiconductor device cells.
Figure 4:
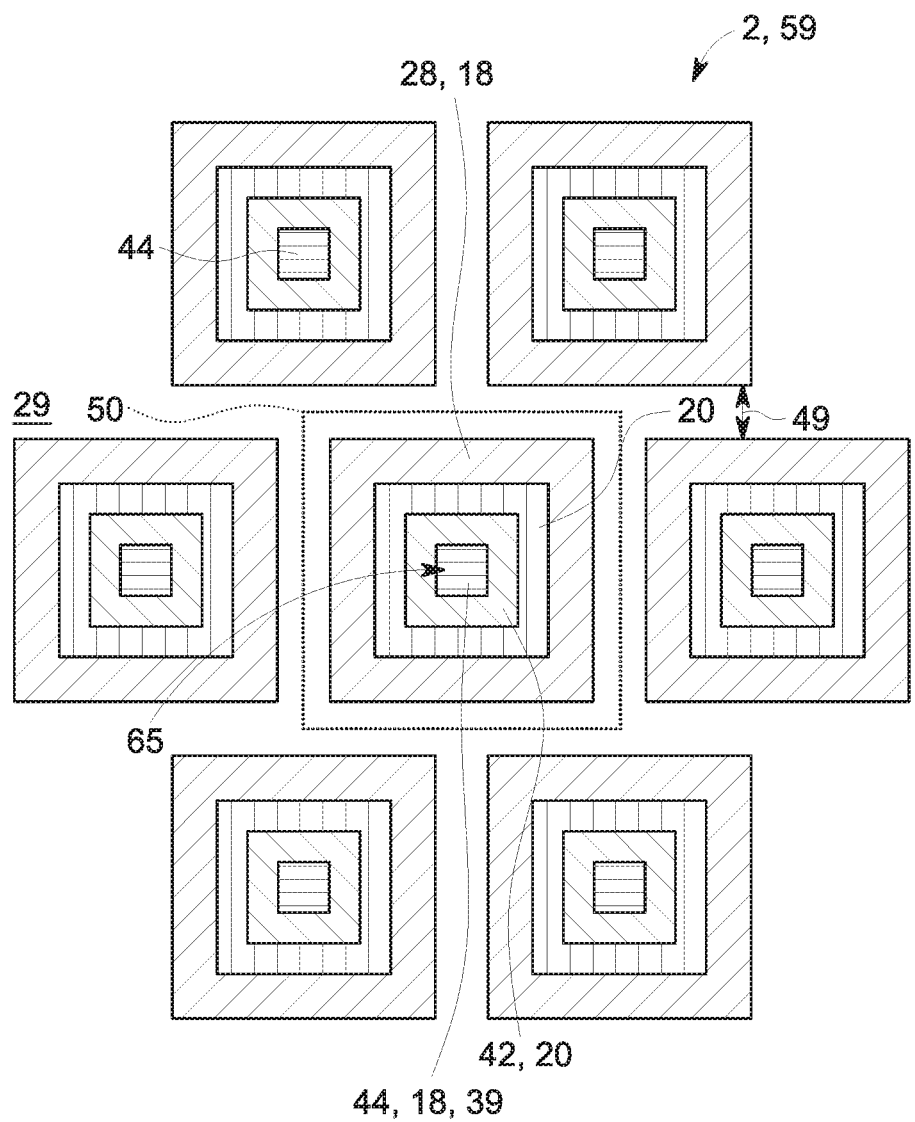
FIG. 4 is a top-down view of a SiC layer that includes a number of staggered square semiconductor device cells.
Figure 5:
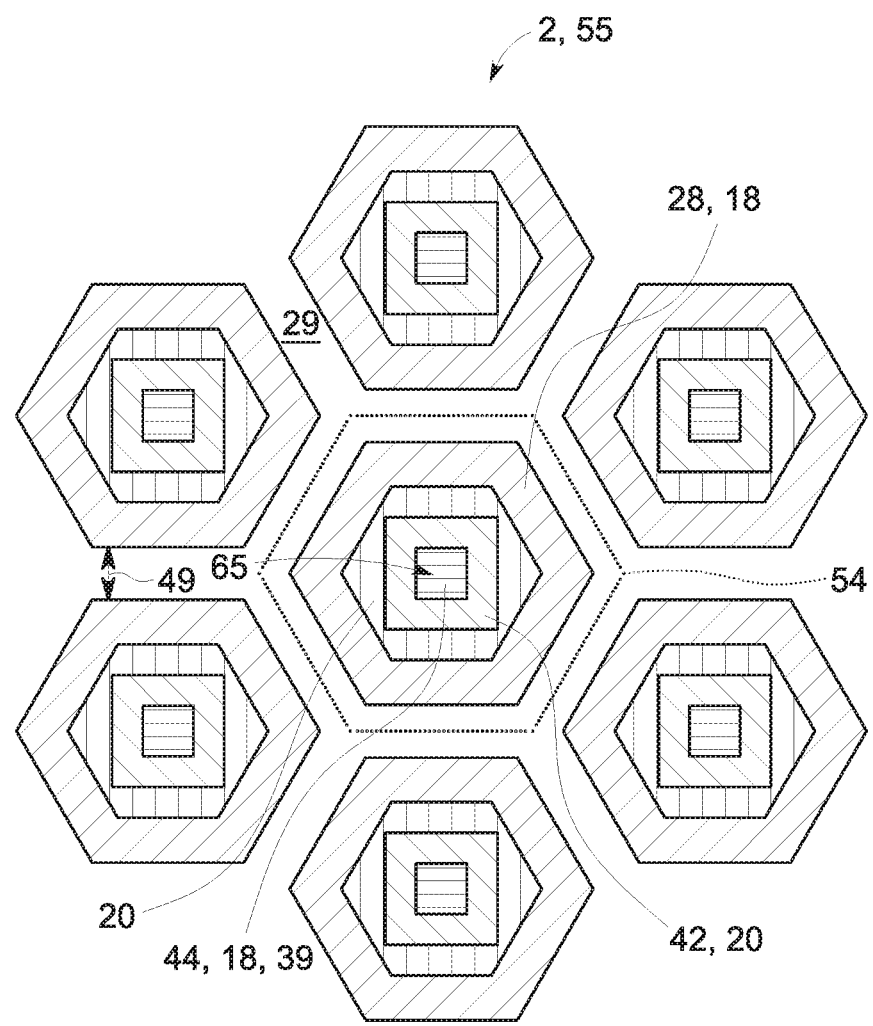
FIG. 5 is a top-down view of a SiC layer that includes a number of hexagonal semiconductor device cells.

One way in which channel resistance ($R_{ch}$ 32) and JFET resistance ($R_{JFET}$ 36) can be reduced for semiconductor devices is through the use of cellular device designs. FIGS. 3-5 illustrate top-down views of a semiconductor device layer 2 having different conventional cellular designs and layouts. These conventional designs may be described as being unshielded relative to the shielded device cells of the present technique discussed below. It may be appreciated that for FIGS. 3-5, as well as for the top-down views of device cells presented below, certain features of the device cells (e.g., gate contact 26, dielectric layer 24, contacts 22) are omitted to provide an unobstructed view of the surface of the semiconductor device layer 2. In particular, FIG. 3 illustrates square device cells 50 in an aligned layout 51, while FIG. 4 illustrates the square cellular device cells 50 in a staggered or offset layout 52. FIG. 5 illustrates hexagonal device cells 54 in an aligned layout 55. In general, the illustrated cell designs and layouts illustrated in FIGS. 3-5 enable reduced $R_{ds}(on)$ by reducing both channel resistance ($R_{ch}$ 32) and the JFET resistance ($R_{JFET}$ 36) relative to a stripe cell layout, as illustrated in FIG. 2. For example, the square device cells 50 of FIG. 3 provide an approximately 20% lower $R_{ds}(on)$ than the stripe device 41 of FIG. 2, assuming similar process/technology limited dimensions (e.g., same $L_{ch}$ 43, $L_{ch\_to\_ohm}$ 45, $W_{ohm}$ 47, and $W_{JFET}$ 49). It may be appreciated that the layouts illustrated herein using a few device cells that represent a subset of the numerous device cells of a semiconductor device on the semiconductor surface 2.

In FIGS. 3-5, the illustrated conventional square device cell 50 and hexagonal device cell 54 each include a body contact region 44 disposed in the center 65 of each cell that, as illustrated in FIG. 1B, is part of the well region 18. The body contact region 44 is surrounded by a source region 20. More specifically, the body contact region 44 of each cell may be surrounded by the source contact region 42 of the source region 20, wherein the doping of the source contact region 42 may be the same as the remainder of the source region 20. The source region 20 of each cell is surrounded by a channel region 28, which also is part of the well region 18, as illustrated in FIGS. 1A and 1B. The channel region 28 is, in turn, surrounded by the JFET region 29. In general, the width of a particular part of the JFET region 29 is defined as the shortest distance between regions having the opposite doping type (e.g., p-type) compared that of JFET region 29 (e.g., n-type). While each device cell includes a JFET region 29 about the perimeter of the cell, these JFET regions 29 may, at times, be collectively referred to as the JFET region 29 of the semiconductor device layer 2 for simplicity. It may also be appreciated that the semiconductor device layer 2, the source region 20, including the source contact region 42, and the JFET region 29 have a first conductivity type (e.g., n-type), while well region 18, including the body contact region 44 and the channel region 28 have a second conductivity type (e.g., p-type). As used herein, two device cells may be referred to as neighboring cells or adjacent cells when any portion of the boundaries of the two cells touch (e.g., along a side 68 or at a corner 69 of the boundary of the device cells). As such, it may be appreciated that, each square device cell 50 of FIG. 3 has eight neighboring or adjacent cells, while each staggered square cell 50 of FIG. 4 and each hexagonal device cell 54 of FIG. 5 has six neighboring or adjacent cells.

While the cellular designs illustrated in FIGS. 3-5 may enable lower $R_{ds}$(on) relative to a stripe cell layout, as illustrated in FIG. 2, it is presently recognized that such cellular designs can have a substantially higher electric field in portions of the JFET region 29 between the corners of the well regions of neighboring device cells under blocking conditions. For SiC MOS devices, the electric field in the dielectric layer 24 (e.g., $SiO_2$) disposed over the JFET region 29 (illustrated in FIGS. 1 and 2) may be around ten times higher compared to that in Si devices when the device cells operate under reverse bias. While SiC is generally robust toward higher electric fields, the dielectric layer 24 may experience breakdown during long term operation, resulting in reliability issues with the SiC device cells 50 and 54.

Figure 6:
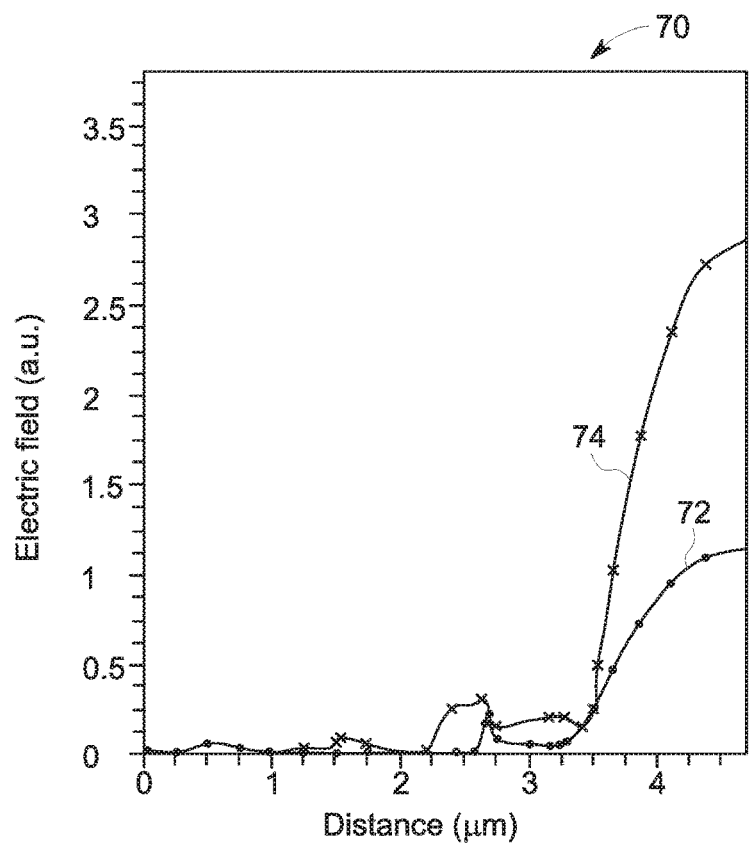
FIG. 6 is a graph depicting normalized electric field strength in a portion of a SiC layer and in a portion of a dielectric layer disposed over the SiC layer, wherein the portion of the SiC layer is disposed between parallel portions of unshielded square device cells under reverse bias.

In particular, in a SiC MOSFET under reverse bias, the electric field present in the widest portion of the JFET region 29 between the corners of the well regions of neighboring device cells 50 and 54 illustrated in FIGS. 3-5 is substantially higher than in other portions of the JFET region 29. As illustrated in FIG. 3, the diagonal distance 60 between the corners of the channel regions 28 of the device cells 50 is greater than the distance 49 between parallel portions (i.e., $W_{JFET,parallel}$ 49) of the channel regions 28 of neighboring device cells 50. FIG. 6 is a graph 70 that plots the strength of the electric field (in arbitrary units (au)) under reverse bias for portions of an unshielded device cell 50 disposed along the arrow 64 illustrated in FIG. 3. More specifically, FIG. 6 includes a first curve 72 illustrating the electric field in the JFET region 29 in FIG. 1A, and includes a second curve 74 illustrating the electric field in the dielectric layer 24 (as illustrated in FIGS. 1A and 1B), for the example unshielded device cell 50 (i.e., 1200 V SiC MOSFET square device cells, having $8 \times 10^{15}$ $cm^{-3}$ epi doped and 11 µm thick drift layer, wherein $W_{JFET,parallel}$ 49 is 2.6 µm) at $V_{ds}$=1200 V. As illustrated in the graph 70 of FIG. 6, at the center 65 of the device cell 50 (i.e., at x=0 µm) the electric field in both the semiconductor device layer 2 and the dielectric layer 24 is low, and the electric field increases to a maximum field strength in the middle of the JFET region 29 (i.e., at approximately x=4.7 µm).

Figure 7A:
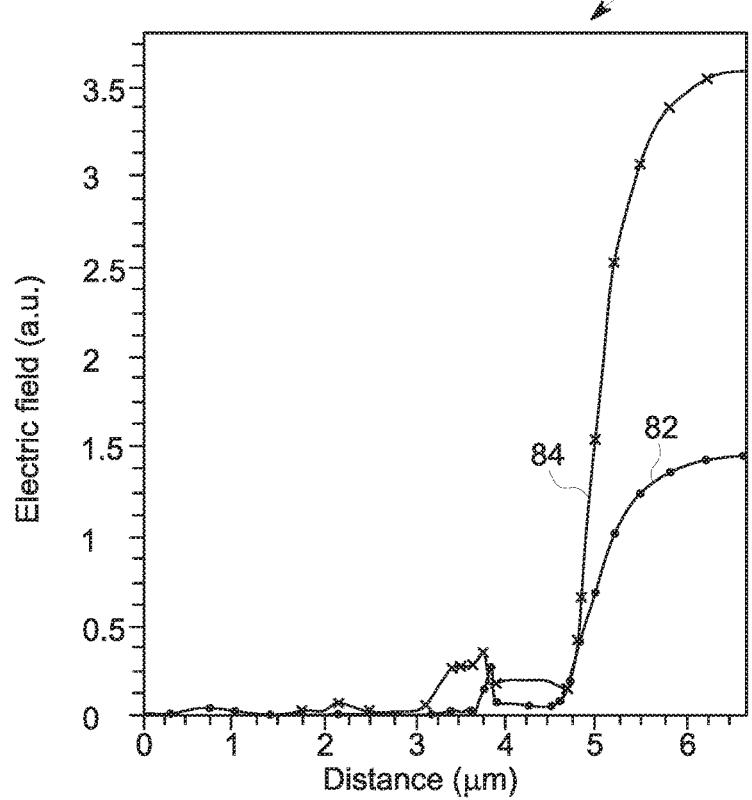
FIG. 7A is a graph depicting normalized electric field strength in a portion of a SiC layer and in a portion of a dielectric layer disposed over the SiC layer, wherein the portion of the SiC layer is disposed between the corners of the well regions of unshielded square device cells under reverse bias.

FIG. 7A is a graph 80 that plots the strength of the electric field (in arbitrary units (au)) for portions of an unshielded SiC device cell 50 under reverse bias, wherein the portions are disposed along the diagonal arrow 66 illustrated in FIG. 3. Like FIG. 6, the graph 80 of FIG. 7A includes a first curve 82 illustrating the electric field in the semiconductor device layer 2, and includes a second curve 84 illustrating the electric field in the dielectric layer 24 disposed over the semiconductor device layer 2 (as illustrated in FIGS. 1A and 1B), for an example conventional SiC device cell 50 having the same dimensions and conditions as indicated for FIG. 6. As illustrated in FIG. 7A, at the center of the conventional SiC device cell 50 (i.e., at x=0 µm) the electric field is low, and, moving diagonally through the corner of the conventional device cell 50, the electric field increases to a peak field strength in the middle of the JFET region 29 (i.e., at approximately x=6.65 µm). Comparing FIGS. 6 and 7, for the example unshielded SiC square cells 50, the peak or maximum electric field between cell corners (i.e., distance 60, along the arrow 66 of FIG. 3) is approximately 20% higher than the peak or maximum electric field between parallel portions of the cells 50 (i.e., distance 49, along the arrow 64 of FIG. 3). As a result, as shown in FIG. 7A, the peak electric field in the dielectric layer 24 is greater between the corners of the well regions 18 of neighboring device cells 50 (e.g., between the corners of the channel regions 28 of neighboring device cells, at the corner 69 where neighboring cells meet), which may result in long term reliability issues for such unshielded device cells 50.

With the foregoing in mind, present embodiments are directed toward cellular device designs that incorporate one or more shielding regions, in the form of implanted extensions of the body region 39 that reduce the electric field in the JFET regions 29 (as well as in the gate dielectric layer 24 illustrated in FIG. 1B) in locations where the corners 69 of neighboring device cells meet without significantly increasing $R_{ds}$(on). Accordingly, the shielding regions of the presently disclosed devices are designed so that the distance between the implant extensions and well regions of neighboring device cells less than or equal to the distance between parallel portions of the well regions of the neighboring device cells. Therefore, the present designs ensure no portion of the JFET region 29 is wider than the width of the JFET region 29 between parallel portions of the channel regions of neighboring device cells (i.e., $W_{JFET,parallel}$ 49). Further, present designs maintain a channel region width and/or a JFET region density that is greater than or equal to that of a conventional stripe device (e.g., stripe cell device 41 of FIG. 2) having comparable dimensions (e.g., same $L_{ch}$, $L_{ch\_to\_ohm}$, $W_{ohm}$). As such, the presently disclosed shielded device cells provide superior performance relative to a conventional stripe device cells of comparable dimensions, while still providing similar reliability (e.g., long-term, high-temperature stability). Furthermore, the shielding regions of the presently disclosed cellular designs may be implanted simultaneously with other features of the device cells, and as such, do not increase the complexity or cost of fabrication.

As mentioned herein, present embodiments are directed towards shielding regions that are body region extensions. An "extension" as used herein, refers to an implanted region generally that extends a feature (e.g., body region 39) of the device cell beyond its typical boundaries. In particular, certain disclosed device designs and layouts include at least one device cell having a body region extension. As used herein, a "body region extension" is an extension of the body region 39 of the device cell that projects outwardly from near the center 65 of the device cell, through the source region 20 and channel region 28 of the device cell, and into a portion of the JFET region 29 where multiple device cells meet. As discussed below, since the distance between the body region extension and the well region of a neighboring device cell then defines the width of this portion the JFET region, the disclosed body region extensions ensure that no portion of the JFET region 29 is wider than $W_{JFET,parallel}$ 49, suppressing aforementioned electric fields and improving device reliability.

As discussed above with respect to FIGS. 1A and 1B, the body region 39 of a device cell may be doped at a higher level than the remainder of the well region 18. The portion of the body region 39 that is disposed below (i.e., directly electrically connected to) the contact 22 is more specifically referred to herein as a body contact region 44. With this in mind, in certain embodiments, a portion of the contact 22 may be disposed over (i.e., directly electrically connected to) at least a portion of the disclosed body region extensions. For such situations, the body region extensions may also be described and referred to as "body contact region extensions." However, in other embodiments, the contact 22 may be disposed over the body contact region 44 and not over the body region extension of the device cell, in accordance with disclosed embodiments.

It may also be appreciated that, in certain embodiments, the disclosed body region extensions may be formed using the same implantation step used to form the body region 39, in which case the body region extensions are substantially the same as the body region 39 in terms of doping concentration and depth. However, in other embodiments, the disclosed body region extension may be formed using a different implantation step than the body region 39 (e.g., a termination implantation step), in which case the body region extension will generally have the same doping concentration and depth as the features formed during that implantation step. It may be noted that the presently disclosed body region extensions, when implanted during the termination step, may additionally or alternatively be referred to and described as "termination implant shield extensions." Additionally, as discussed below, the disclosed body region extensions may have a particular width, or a maximum width, that is generally the same size or smaller than the width of the other features defined during the same implant operation (e.g., the width of the body region 39). In certain embodiments, the disclosed body region extensions may have a width that is defined or limited by the lower practically achievable limit for defining features using present lithography/implantation techniques. For example, in certain embodiments, the width of the disclosed body region extensions may be less than approximately 1 µm (e.g., between approximately 0.1 µm and approximately 1 µm) or less than approximately 0.5 µm (e.g., between approximately 0.1 µm and approximately 0.5 µm). In certain embodiments, the width of the body region extensions may be relatively constant or may vary across the length of the body region extension.

Figure 30:
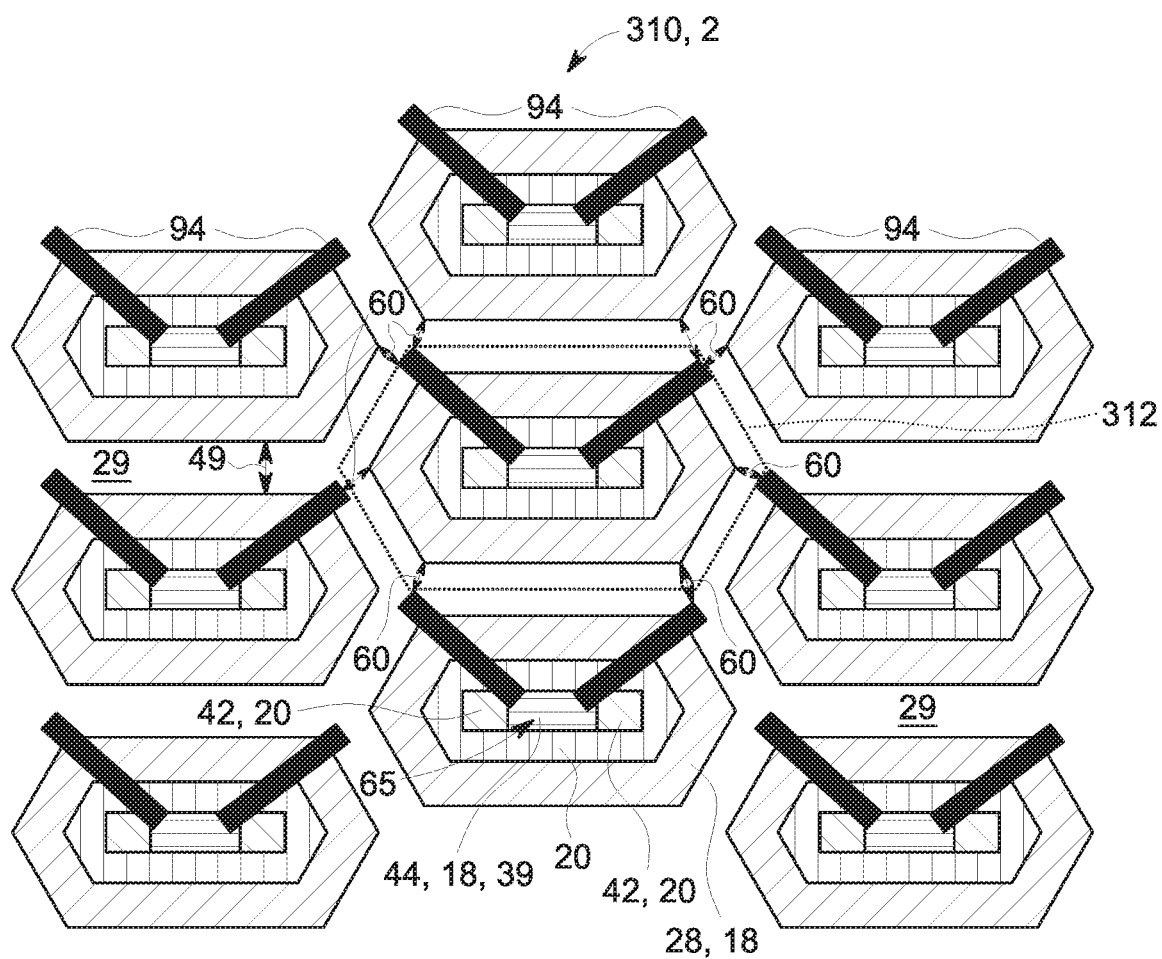
FIGS. 30 and 31 are top-down views of SiC layers having device layouts that include a number of elongated hexagonal SiC device cells with different examples of body region extensions, in accordance with embodiments of the present technique.
Figure 31:
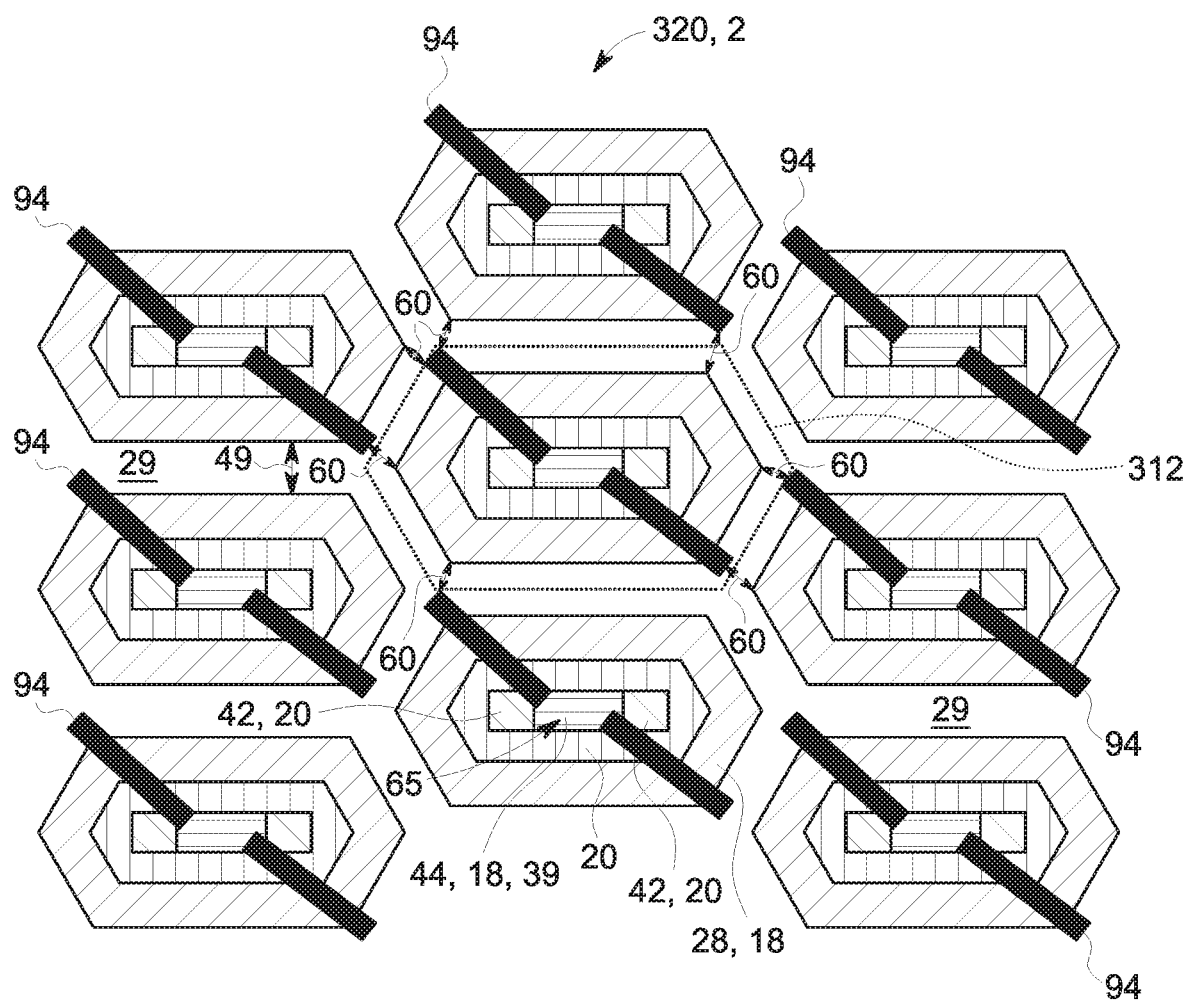

FIGS. 8-31 illustrate top-down views of embodiments of a semiconductor device layer 2 with various device cells and layouts that include at least one body region extension to reduce the electric field in the JFET region between device well regions. More specifically, FIGS. 8-15 illustrate example layouts of square device cells, FIGS. 16-20 illustrate example layouts of elongated rectangular device cells, FIGS. 21-29 illustrate example layouts of hexagonal device cells, and FIGS. 30-31 illustrate example layouts of elongated hexagonal device cells, each layout including a plurality of body region extensions. The elongated rectangular device cells of FIGS. 16-20 and the elongated hexagonal device cells of FIGS. 30 and 31 may include one or more features described in co-pending U.S. patent application Ser. Nos. 14/313,785 and 14/313,820, both entitled, "CELLULAR LAYOUT FOR SEMICONDUCTOR DEVICES," both filed Jun. 24, 2014, which are incorporated by reference herein in their entireties for all purposes. It may be appreciated that while a number of different example embodiments of device designs and layouts are presented, these are merely intended to be examples. As such, in other embodiments, the body region extensions of the present approach may have other shapes (e.g., square, rounded, elongated or distorted shapes) without negating the effect of the present approach. It also may be appreciated that the channel and/or JFET density of the disclosed cellular layout embodiments illustrated in FIGS. 8-31 is generally greater than that of a stripe device 41, as illustrated in FIG. 2, having the same design parameters. It should be appreciated that the cellular designs and layouts presented below are merely provided as examples, and that, in other embodiments, other variations of cellular designs and layouts may include body region extensions, in accordance with the present disclosure.

Figure 8:
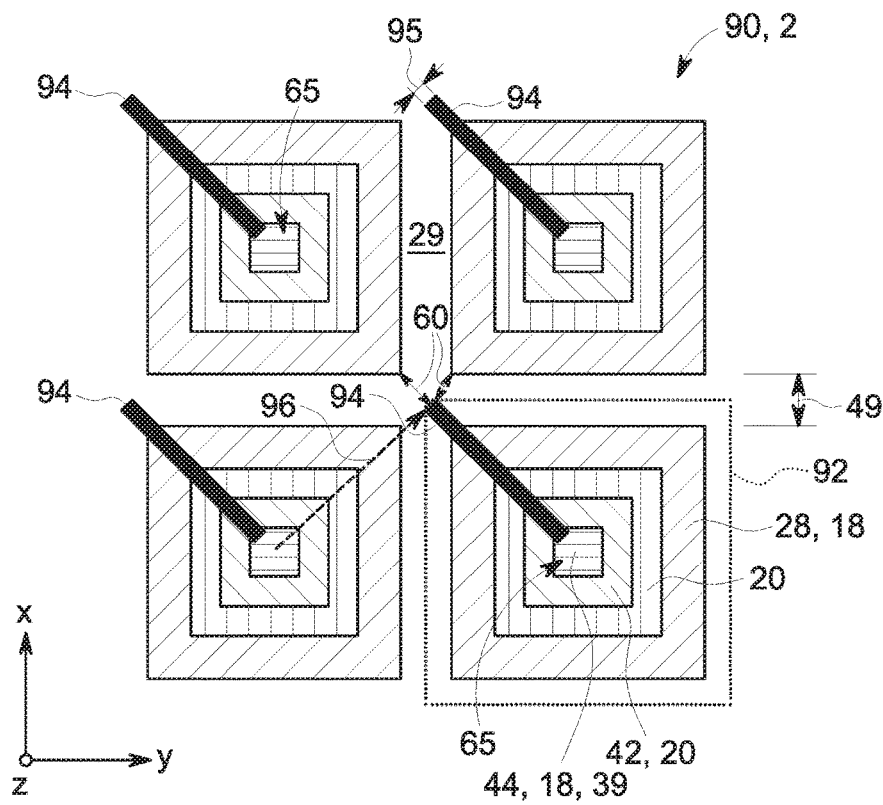
FIGS. 8-15 are a top-down views of SiC layers having device layouts that include a number of square SiC device cells with different examples of body region extensions, in accordance with embodiments of the present technique.

With the foregoing in mind, FIG. 8 illustrates a device layout 90 that includes a number of square device cells 92, in accordance with embodiments of the present technique. The illustrated square device cells 92 each include a single body region extension 94 having a particular width 95. The body region extensions 94 extend from the body region 39, disposed near the center 65 of each device cell 92, through the source region 20, through the channel region 28, and outwardly into the JFET region 29. As discussed above, the body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 illustrated in FIG. 8 extend from the body region 39, through one corner of the source contact region 42, through one corner of the source region 20, and through one corner of the channel region 28, and into the JFET region 29. Additionally, the body region extensions 94 illustrated in FIG. 8 are oriented substantially in the same direction, meaning that they extend through an equivalent corner of well region 18 of each cell 92.

Figure 7B:
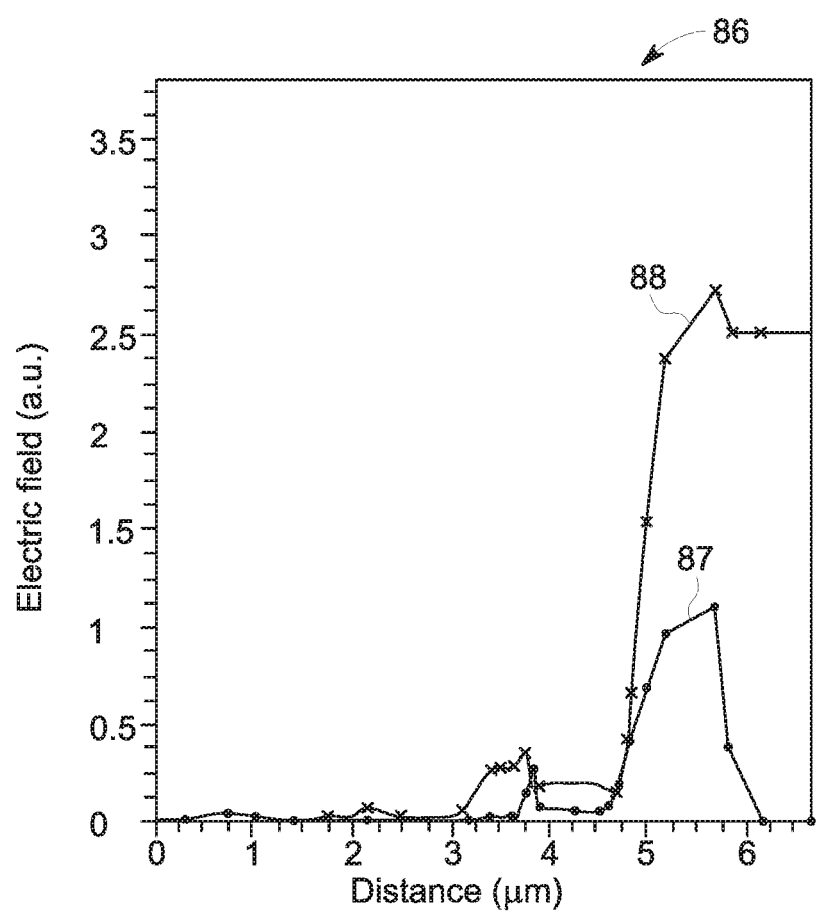
FIG. 7B is a graph depicting normalized electric field strength in a portion of a SiC layer and in a portion of a dielectric layer disposed over the SiC layer, wherein the portion of the SiC layer is disposed between the corners of the well regions of square device cells that are shielded by a body region extension and operating reverse bias, in accordance with embodiments of the present technique.

To illustrate the improvement provided by the disclosed body region extensions 94, FIG. 7B is a graph 86 that plots the magnitude of the electric field (in the same arbitrary units (a.u.) as FIGS. 6 and 7A) for portions of an embodiment of a SiC device cell 92 of FIG. 8 under reverse bias, wherein the particular portions of the device cell 92 are disposed along the diagonal arrow 96 illustrated in FIG. 8. Like FIGS. 6 and 7A, the graph 86 of FIG. 7B includes a first curve 87 illustrating the electric field in the SiC layer 2, and includes a second curve 88 illustrating the electric field in the dielectric layer 24 disposed over the SiC layer 2 (as illustrated in FIGS. 1A and 1B), for an example SiC device cell 92 having the same dimensions as the unshielded device cells represented in FIGS. 6 and 7A. As illustrated in FIG. 7B, at the center 65 of the SiC device cell 92 (i.e., at x=0 µm) the electric field in both the SiC layer 2 and the dielectric layer 24 is low, and, moving diagonally through the corner of the device cell 92, the electric field increases to a peak field strength (i.e., at approximately x=5.5 µm) before reaching the body region extension 94 (i.e., at approximately x=5.75 µm), and thereafter the magnitude of the electric field sharply declines. A corresponding decline is also observed in the dielectric layer 24, as illustrated by the curve 88. Comparing FIGS. 7A and 7B, the peak or maximum electric field between the corners of the well regions of the shielded SiC device cells 92 (i.e., along the arrow 96) of FIG. 8 is approximately 20% lower than the peak or maximum electric field between the corners (i.e., along the arrow 66) for the unshielded SiC square cells 50 of FIG. 3. As a result, as shown in FIG. 7B, the peak electric field in the dielectric layer 24 is lower in the portion of the JFET region 29 that is between the corners of the well regions neighboring device cells 92, which may result in improved long term reliability for these SiC device cells 92.

Figure 9:
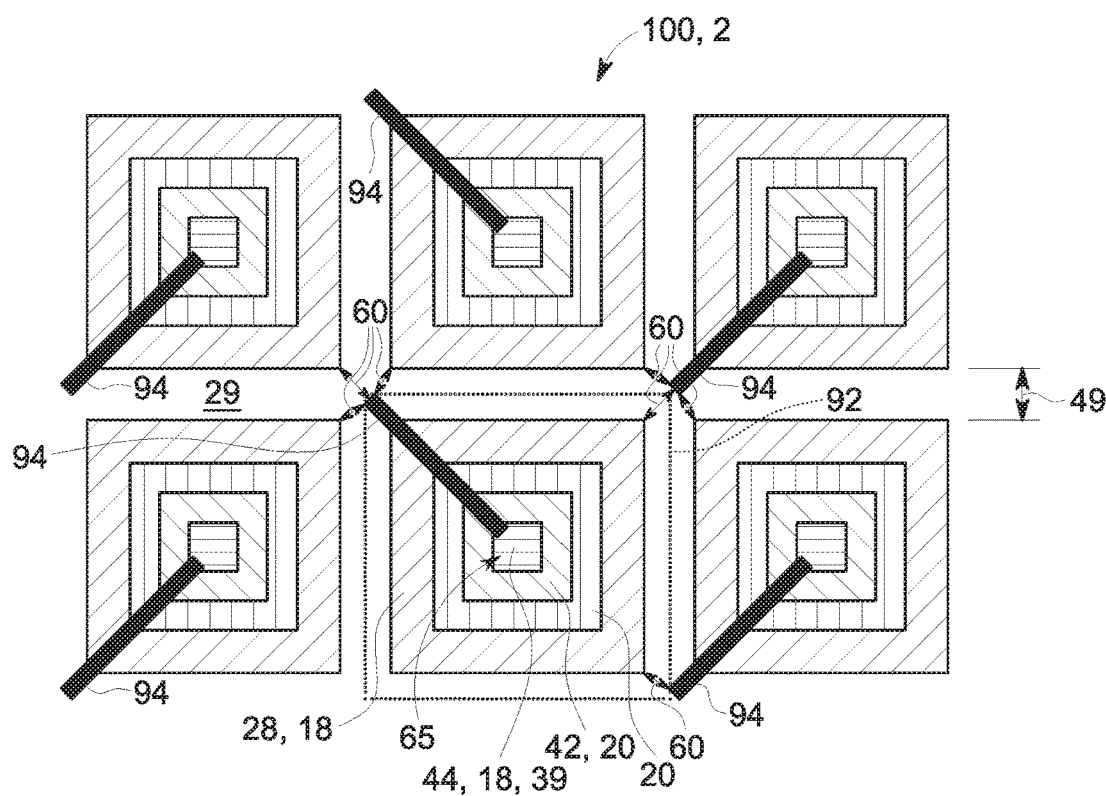

FIG. 9 illustrates a device layout 100 that includes a number of square device cells 92, in accordance with embodiments of the present technique. The square device cells 92 of FIG. 9 each include a single body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 of FIG. 9 extend from the body region 39, through one corner of the source contact region 42, through one corner of the source region 20, and through one corner of the channel region 28, and into the JFET region 29. As such, a number of the body region extensions 94 of the device cells 92 illustrated in FIG. 9 are either oriented substantially parallel or substantially perpendicular relative to the body region extensions 94 of neighboring device cells 92.

Figure 10:
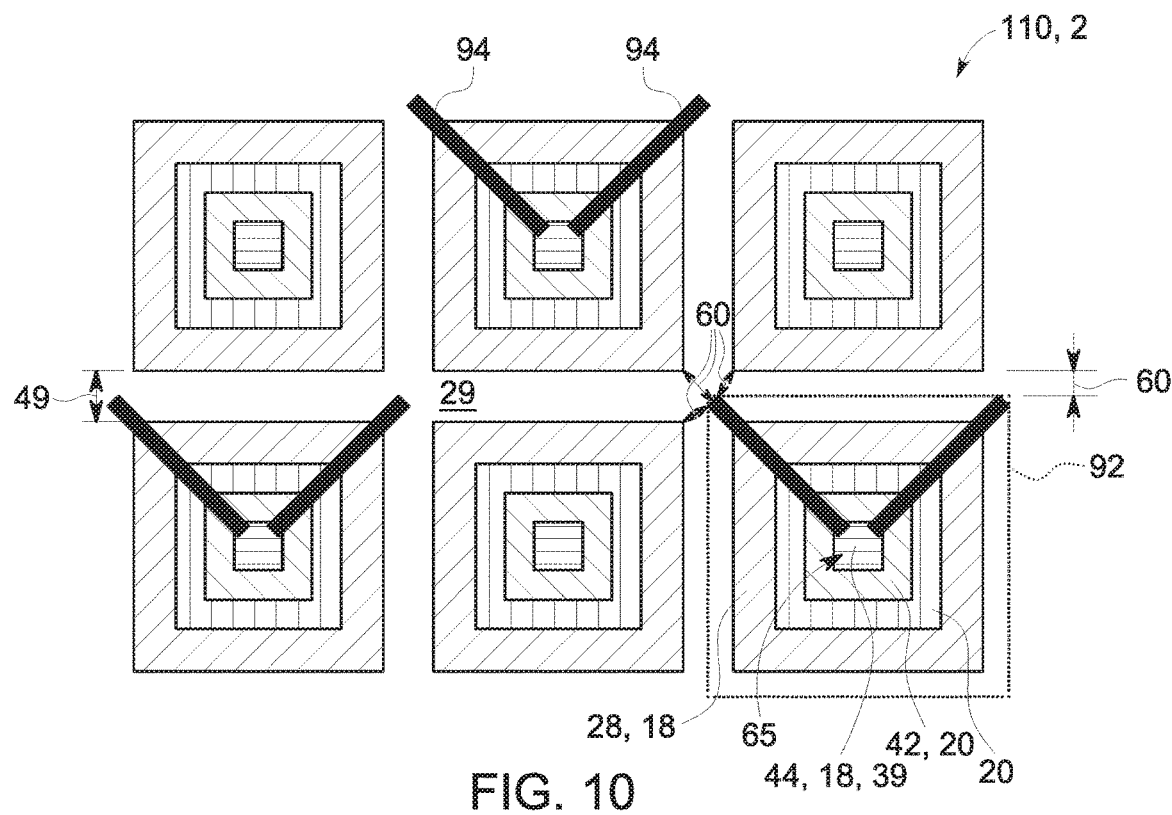

FIG. 10 illustrates a device layout 110 that includes a number of square device cells 92, in accordance with embodiments of the present technique. A portion of the square device cells 92 of the cells 92 of FIG. 10 include a body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 of FIG. 10 extend from the body region 39, through two adjacent corners of the source contact region 42, through two adjacent corners of the source region 20, through two adjacent corners of the channel region 28, and into the JFET region 29. Further, as illustrated by the layout 110 of FIG. 10, the device cells 92 that do not include the body extensions 94 extending from their body regions 39 are separated (e.g., surrounded on four sides) by device cells 92 that include the body extensions 94.

Figure 11:
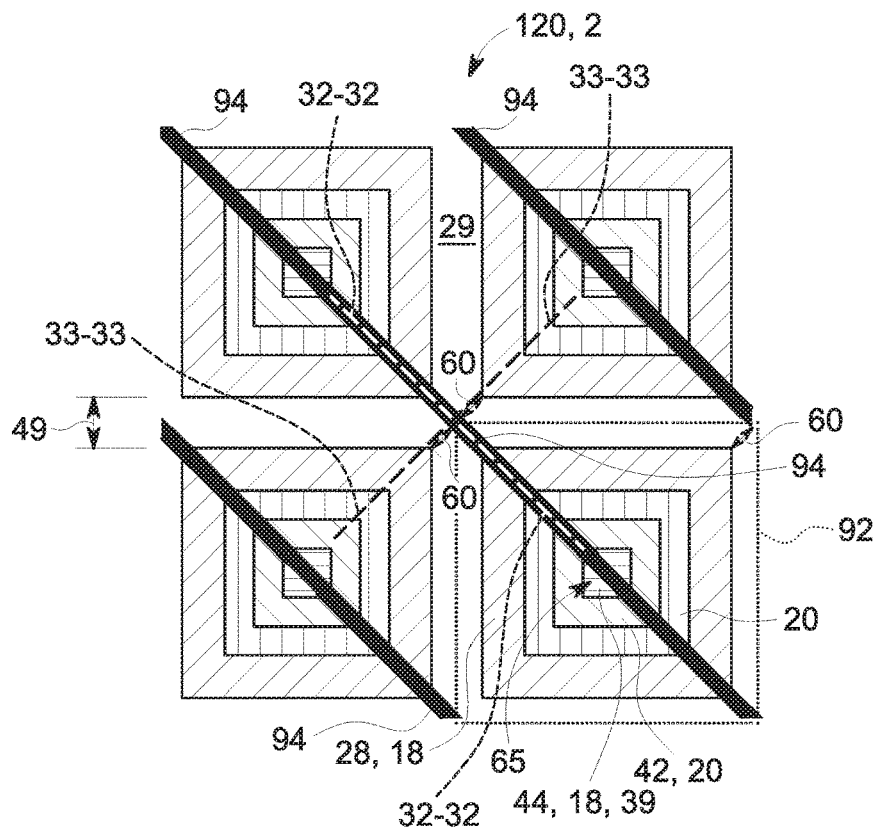
Figure 32:
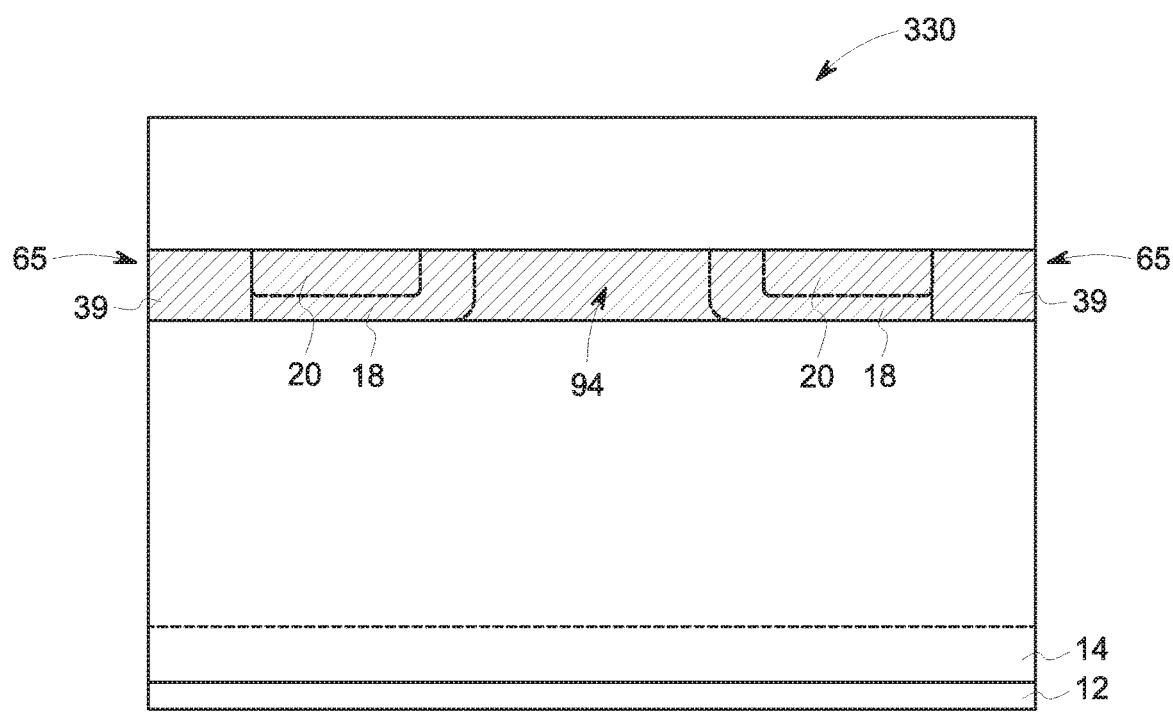
FIG. 32 is a cross-sectional view of the SiC layers of FIG. 11 along line 32-32.
Figure 33:
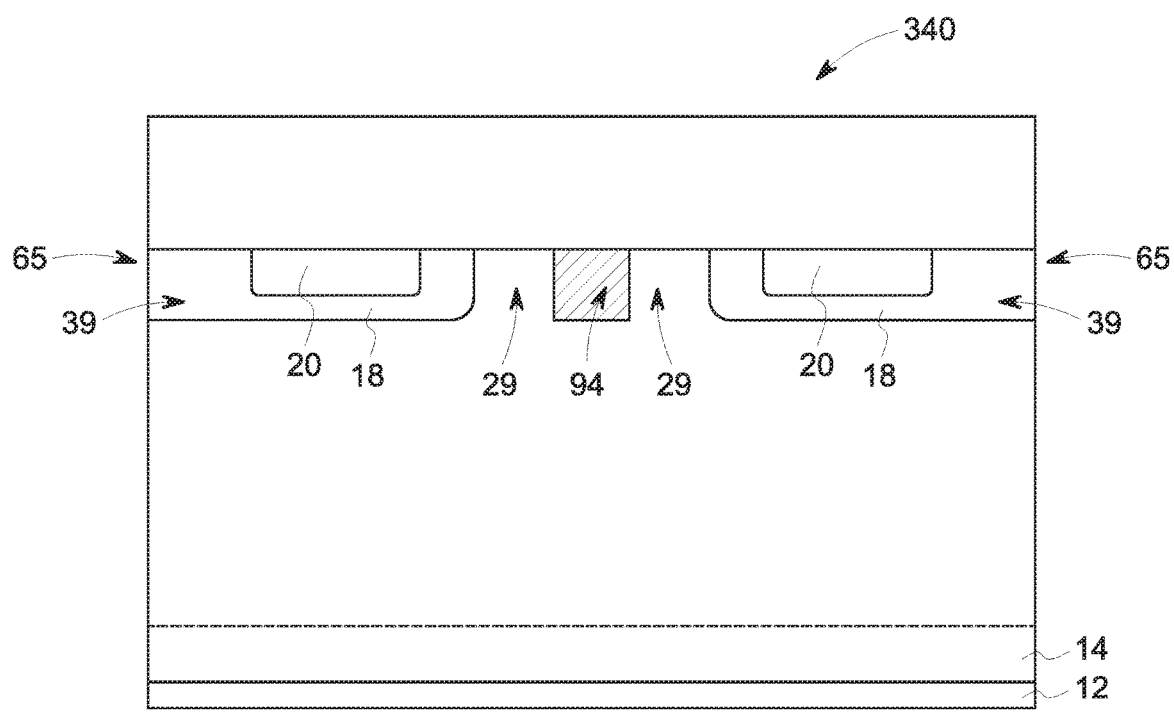
FIG. 33 is a cross-sectional view of the SiC layers of FIG. 11 along line 33-33.

In certain embodiments, the body region extensions 94 of the device cells 92 can extend all the way through the JFET region 29 and connect to one another. It may be appreciated that, while such designs provide effective shielding, they may also result in slightly higher $R_{ds}$(on), relative to designs in which the body region extensions 94 do not connect, due to a slightly lower channel/JFET density for a given extension width 95. On the other hand, a continuous stripe extension technologically can have smaller width 95, thus minimizing impact on $R_{ds}$(on). For example, FIG. 11 illustrates a device layout 120 that includes a number of square device cells 92, in accordance with embodiments of the present technique. Each of the square device cells 92 of FIG. 11 include a body region extension 94 (i.e., a continuous stripe extension 94) that extends from the body region 39, disposed near the center 65 of each device cell 92, through the source region 20, through the channel region 28, and outwardly into the JFET region 29 to couple with (overlap with) one another. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 of FIG. 11 extend from the body region 39, through two opposite corners of the source contact region 42, through two opposite corners of the source region 20, and through two opposite corners of the channel region 28, and into the JFET region 29 to connect to the body region extensions 94 of neighboring cells 92. Additionally, to provide an alternate view of the body region extensions 94, FIGS. 32 and 33 are cross-sectional views of portions of the embodiment of the device layout 120 of FIG. 11, taken along lines 32-32 and 33-33, respectively.

Figure 12:
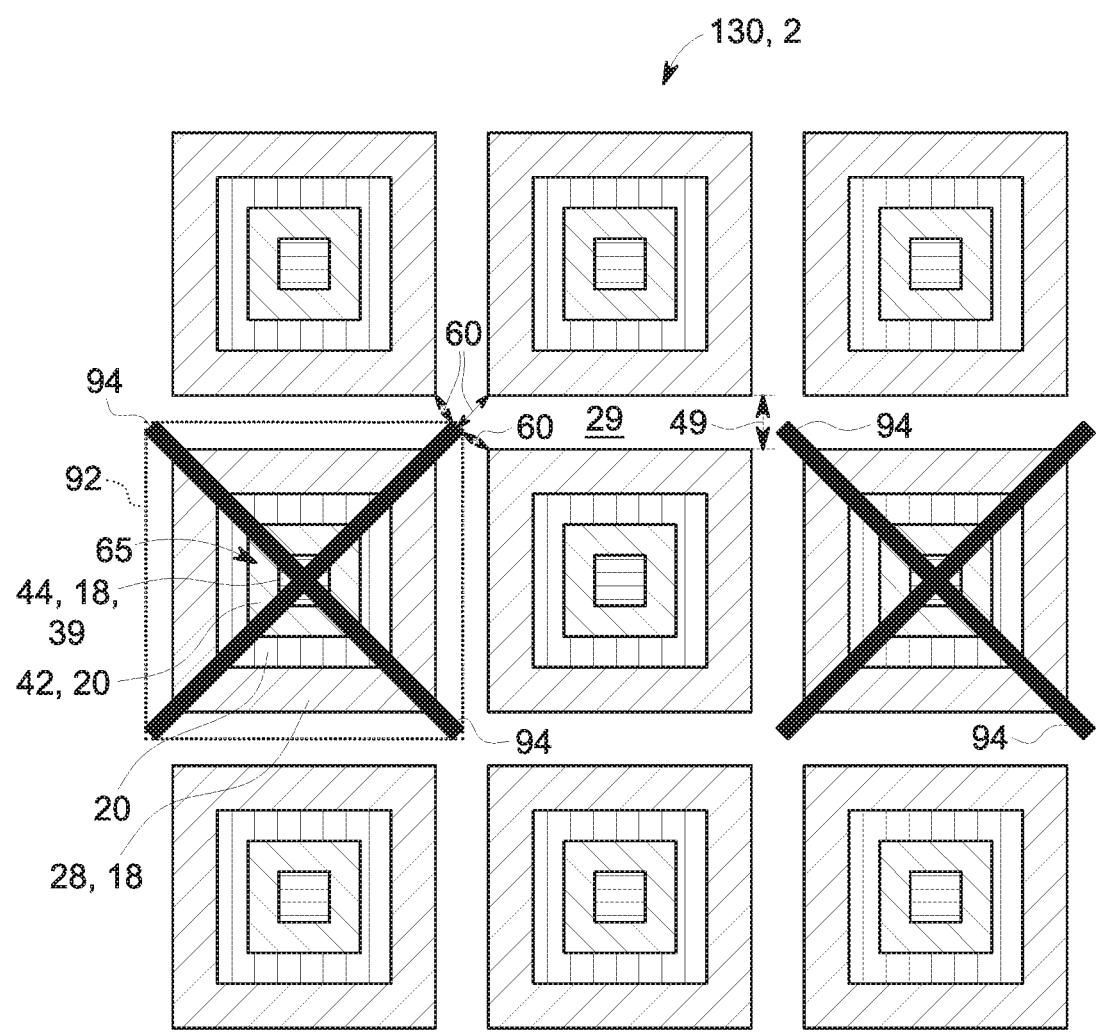

FIG. 12 illustrates a device layout 130 that includes a number of square device cells 92, in accordance with embodiments of the present technique. A portion of the square device cells 92 of FIG. 10 include a body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of certain cells 92 of FIG. 12 extend from the body region 39, through two sets of opposite corners (e.g., all corners) of the source contact region 42, through two sets of opposite corners (e.g., all corners) of the source region 20, and through two sets of opposite corners (e.g., all corners) of the channel region 28, and into the JFET region 29. Further, as illustrated by the layout 130 of FIG. 12, the device cells 92 that include the body extensions 94 are separated (e.g., isolated, surrounded on four sides and four corners, surrounded on all sides) by neighboring device cells 92 that do not include the body extensions 94 extending from their body regions 39.

Figure 13:
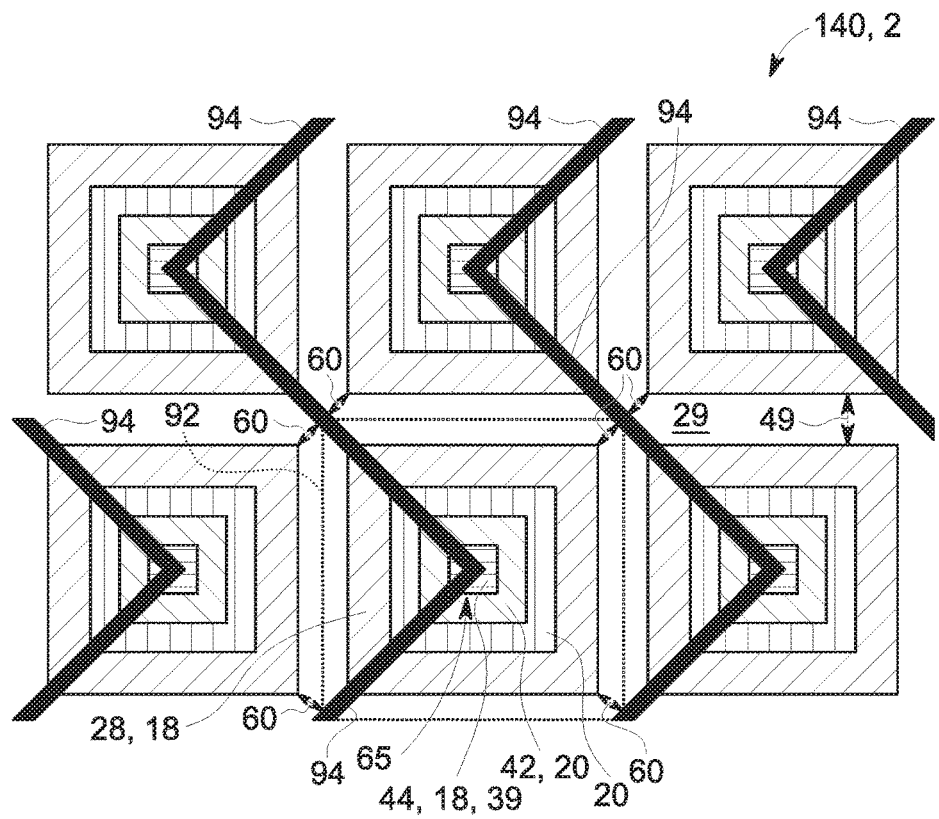

FIG. 13 illustrates a device layout 140 that includes a number of square device cells 92, in accordance with embodiments of the present technique. All of the illustrated square device cells 92 of FIG. 13 include a body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 of FIG. 13 extend from the body region 39, through adjacent corners of the source contact region 42, through adjacent corners of the source region 20, and through adjacent corners of the channel region 28, and through the JFET region 29 to connect to the body region extensions 94 of neighboring cells 92.

Figure 14:
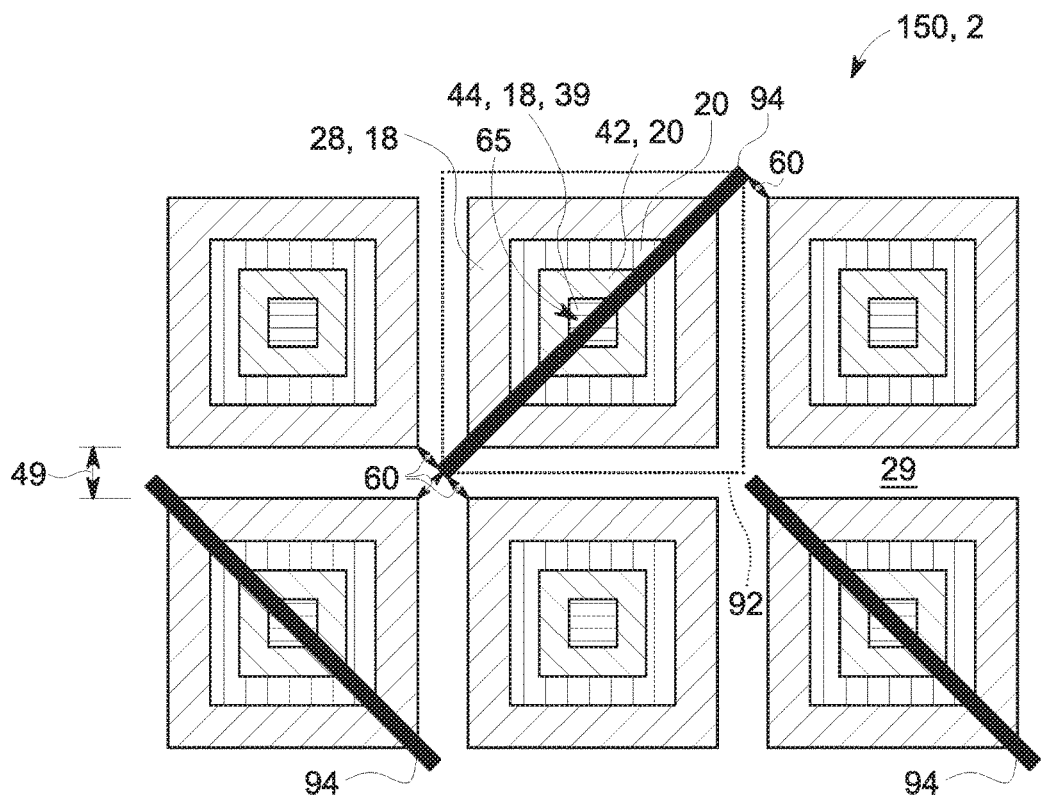

FIG. 14 illustrates a device layout 150 that includes a number of square device cells 92, in accordance with embodiments of the present technique. A portion of the square device cells 92 of FIG. 14 include a body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of certain cells 92 of FIG. 14 extend from the body region 39, through opposite corners of the source contact region 42, through opposite corners of the source region 20, and through opposite corners of the channel region 28, and into the JFET region 29. Further, as illustrated by the layout 150 of FIG. 14, the device cells 92 that include the body extensions 94 are separated (e.g., isolated, surrounded on all sides) by device cells 92 that do not include the body extensions 94 extending from their body regions 39.

Figure 15:
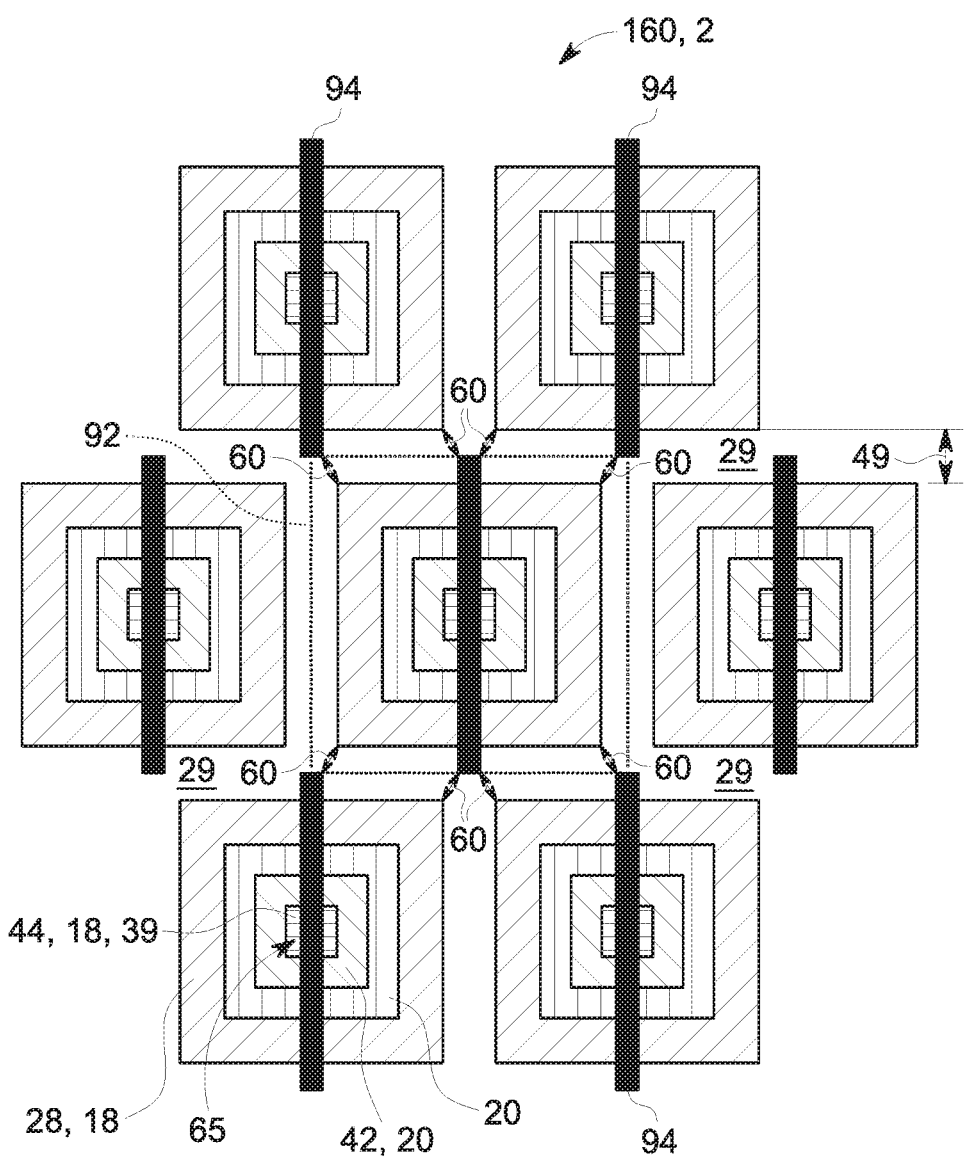

The disclosed body region extensions 94 may also be used, for example, with other layouts of square cellular devices. For example, FIG. 15 illustrates a device layout 160 that includes a number of staggered square device cells 92, in accordance with embodiments of the present technique. Each of the square device cells 92 of FIG. 15 includes a body region extension 94 that extends from the body region 39, disposed near the center 65 of each device cell 92, through the source region 20, through the channel region 28, and outwardly into the JFET region 29. The illustrated body region extensions 94 generally ensure that all of the distances 60 between the well regions 18 and the body region extensions 94 of neighboring device cells 92 (e.g., between regions of neighboring device cells 92 that have the second type of conductivity) are less than or equal to the distance 49 between parallel portions of the well regions 18 of the neighboring cells 92. In other words, the body region extensions 94 generally ensure that no portion of the JFET region 29 is wider than $W_{JFET,parallel}$ 49. The body region extensions 94 of the cells 92 of FIG. 15 extend from the body region 39, through two opposite sides of the source contact region 42, through two opposite sides of the source region 20, and through two opposite sides of the channel region 28, and into the JFET region 29. The body region extensions 94 of the cells 92 of FIG. 15 may also be described generally bisecting the device cell 92 (e.g., bisecting the source contact region 42, the source region 20, and/or the channel region 28 of the device cell 92).

Figure 16:
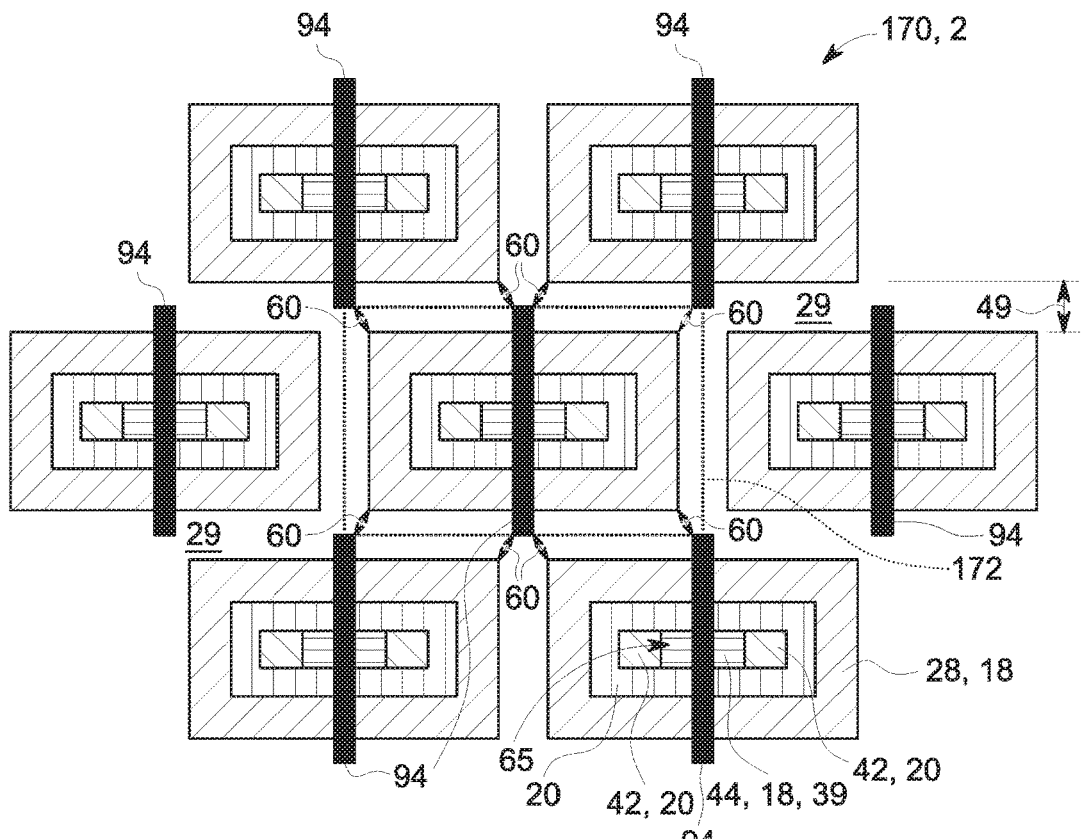
FIGS. 16-20 are top-down views of SiC layers having device layouts that include a number of elongated rectangular SiC device cells with different examples of body region extensions, in accordance with embodiments of the present technique.

As mentioned, the presently disclosed body region extensions 94 may also be used with device cells having other shapes. For example, FIG. 16 illustrates a device layout 170 that includes a number of elongated rectangular device cells 172, in accordance with embodiments of the present technique. Each of the device cells 172 of FIG. 16 includes a body region extension 94 that extends from the body region 39, disposed near the center 65 of each device cell 172, through the source region 20, through the channel region, and outwardly into the JFET region 29. The illustrated body region extensions 94 generally ensure that all of the distances 60 between the well regions 18 and the body region extensions 94 of neighboring device cells 172 (e.g., between regions of neighboring device cells 172 that have the second type of conductivity) are less than or equal to the distance 49 between parallel portions of the well regions 18 of the neighboring cells 172. In other words, the body region extensions 94 generally ensure that no portion of the JFET region 29 is wider than $W_{JFET,\ parallel}$ 49. The body region extensions 94 of the cells 172 of FIG. 15 extend from the body region 39, through two opposite sides of the source region 20, through two opposite sides of the channel region 28, and into the JFET region 29. As such, due to the difference in cell design, the body region extensions 94 illustrated in FIG. 16 do not traverse the source contact regions 42, like other disclosed embodiments. The body region extensions 94 of the cells 172 of FIG. 15 may also be described generally bisecting the device cell 172 (e.g., bisecting the body region 39, the source region 20 and/or the channel region 28 of the device cells 172).

Figure 17:
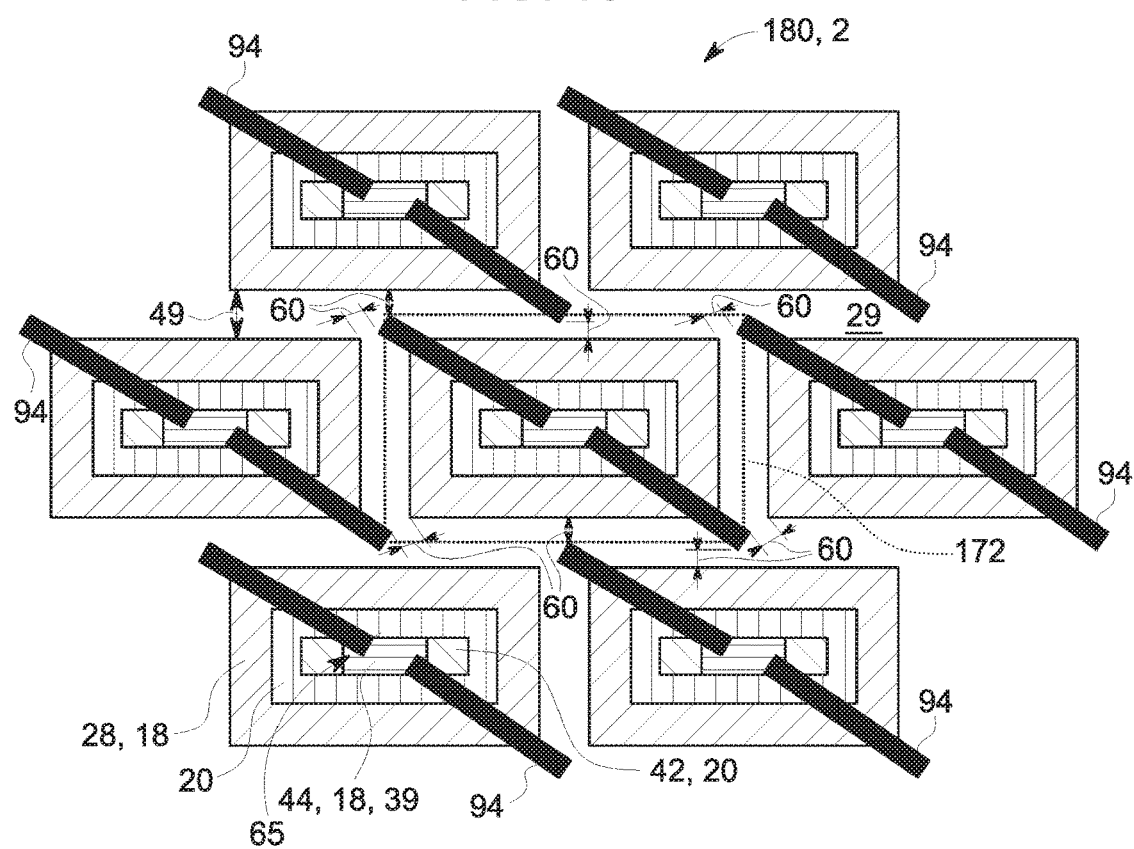

FIG. 17 illustrates a device layout 180 that includes a number of elongated rectangular device cells 172, in accordance with embodiments of the present technique. Each of the device cells 172 of FIG. 16 includes a body region extension 94 that extends from the body region 39, disposed near the center 65 of each device cell 172, through the source region 20, through the channel region 28, and outwardly into the JFET region 29. The illustrated body region extensions 94 generally ensure that all of the distances 60 between the well regions 18 and the body region extensions 94 of neighboring device cells 172 (e.g., between regions of neighboring device cells 172 that have the second type of conductivity) are less than or equal to the distance 49 between parallel portions of the well regions 18 of the neighboring cells 172. In other words, the body region extensions 94 generally ensure that no portion of the JFET region 29 is wider than $W_{JFET,parallel}$ 49. The body region extensions 94 of the cells 172 of FIG. 17 extend from the body region 39, through a portion of the source contact regions 42, through portions of the source region 20, through two opposite corners of the channel region 28, and into the JFET region 29.

Figure 18:
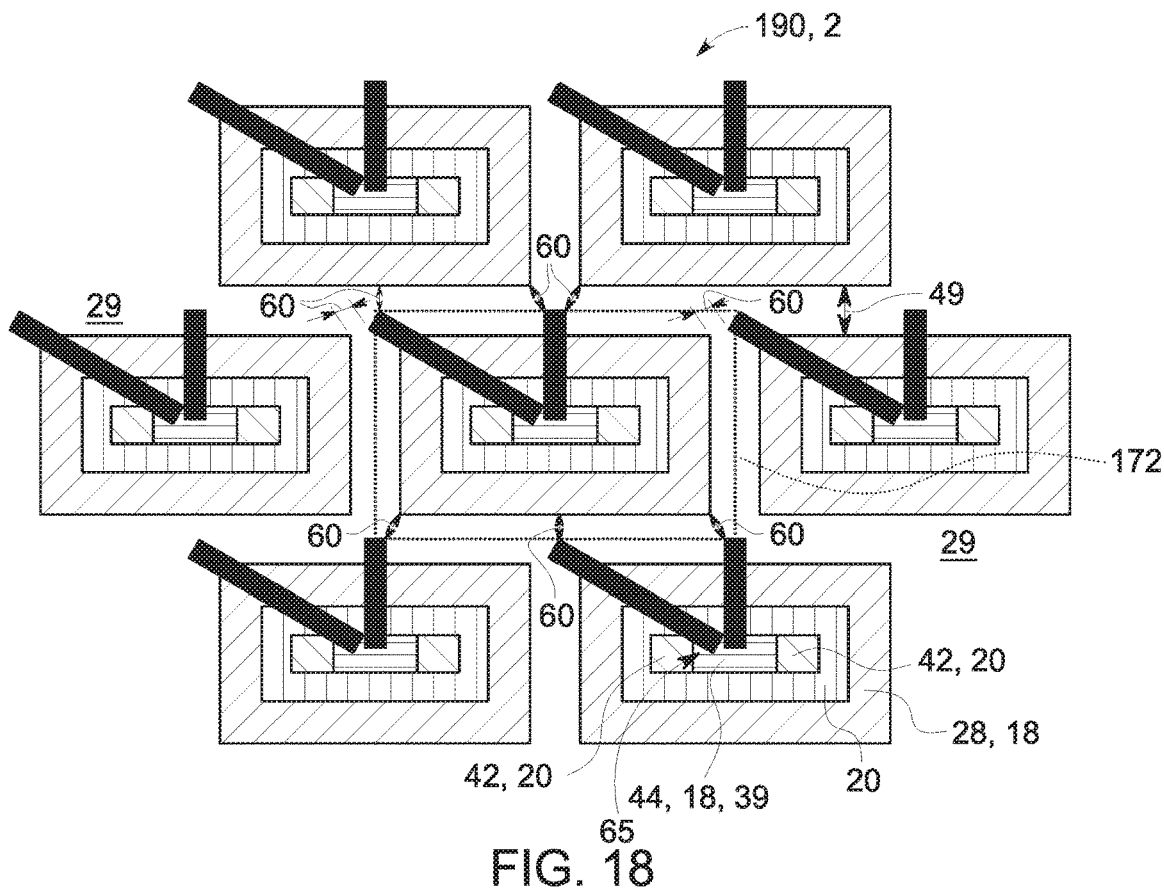

FIG. 18 illustrates a device layout 190 that includes a number of elongated rectangular device cells 172, in accordance with embodiments of the present technique. Each of the device cells 172 of FIG. 18 includes a body region extension 94 that extends from the body region 39, disposed near the center 65 of each device cell 172, through the source region 20, through the channel region 28, and outwardly into the JFET region 29. The illustrated body region extensions 94 generally ensure that all of the distances 60 between the well regions 18 and the body region extensions 94 of neighboring device cells 172 (e.g., between regions of neighboring device cells 172 that have the second type of conductivity) are less than or equal to the distance 49 between parallel portions of the well regions 18 of the neighboring cells 172. In other words, the body region extensions 94 generally ensure that no portion of the JFET region 29 is wider than $W_{JFET,parallel}$ 49. The body region extensions 94 of the cells 172 of FIG. 18 include a first portion that extends from the body region 39, through a portion of a source contact region 42, through a portion of the source region 20, through a corner of the channel region 28, and into the JFET region 29, and include a second portion that extends from the body region 39, through a side of the source region 20, through a side of the channel region 28, and into the JFET region 29. For the device cells 172 illustrated in FIG. 18, the corners and the sides traversed by the body region extension 94 are adjacent to one another.

Figure 19:
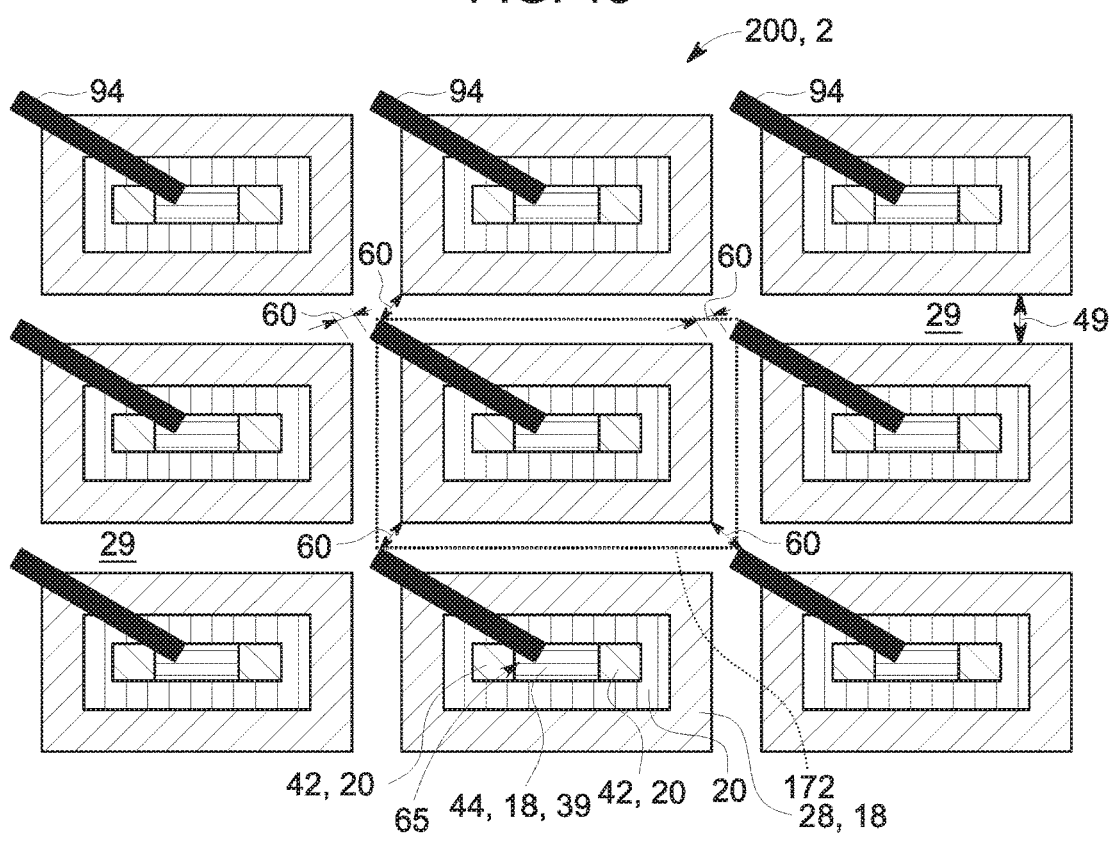

FIG. 19 illustrates a device layout 200 that includes a number of elongated rectangular device cells 172, in accordance with embodiments of the present technique. Each of the device cells 172 of FIG. 19 includes a body region extension 94 that extends from the body region 39, disposed near the center 65 of each device cell 172, through the source region 20, through the channel region 28, and outwardly into the JFET region 29. The illustrated body region extensions 94 generally ensure that all of the distances 60 between the well regions 18 and the body region extensions 94 of neighboring device cells 172 (e.g., between regions of neighboring device cells 172 that have the second type of conductivity) are less than or equal to the distance 49 between parallel portions of the well regions 18 of the neighboring cells 172. In other words, the body region extensions 94 generally ensure that no portion of the JFET region 29 is wider than $W_{JFET,parallel}$ 49. The body region extensions 94 of the cells 172 of FIG. 19 extend from the body region 39, through a portion of a source contact region 42, through a portion of the source region 20, through a corner of the channel region 28, and into the JFET region 29. Additionally, the body region extensions 94 illustrated in FIG. 19 are oriented substantially in the same direction, meaning that they extend through the equivalent corner of each cell 172, and are substantially parallel to one another.

Figure 20:
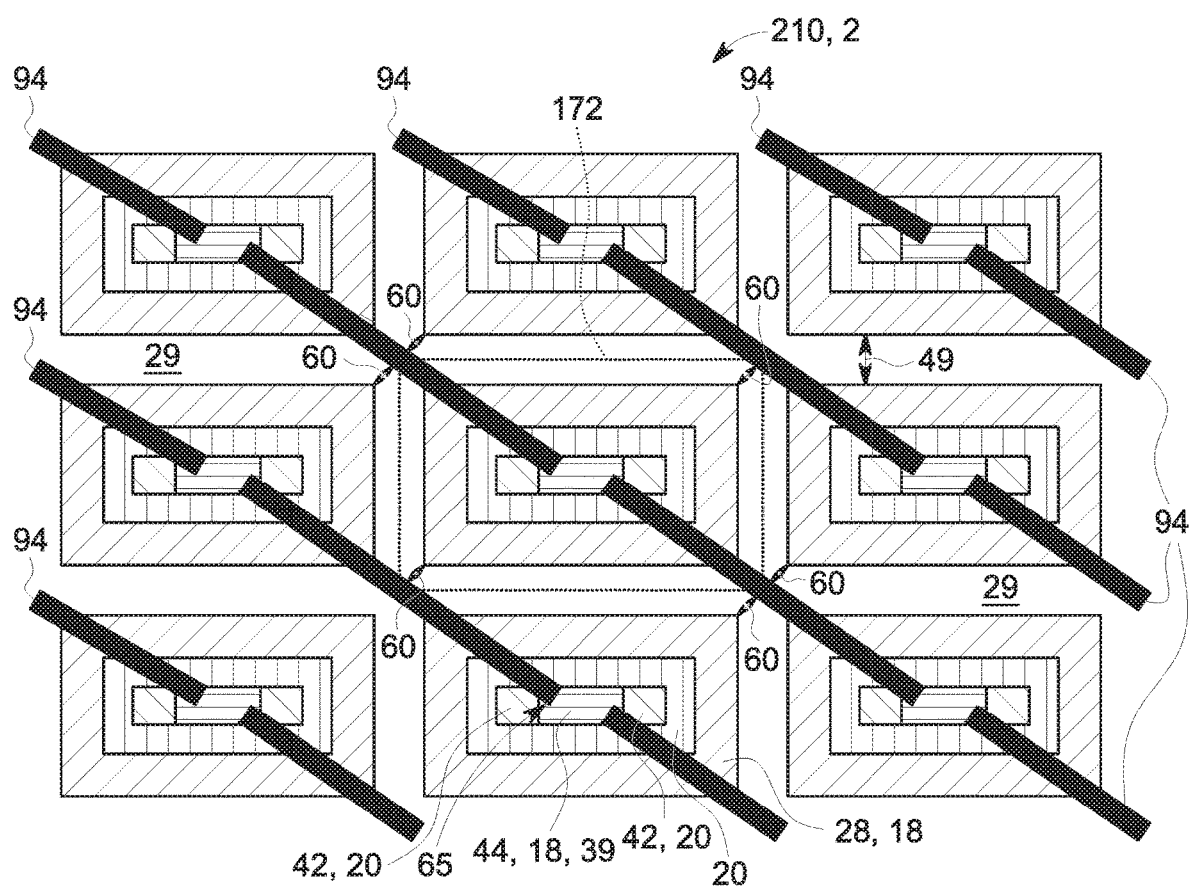

FIG. 20 illustrates a device layout 210 that includes a number of elongated rectangular device cells 172, in accordance with embodiments of the present technique. All of the device cells 172 of FIG. 20 include a body region extension 94 that extends from the body region 39, disposed near the center 65 of each device cell 172, through the source region 20, through the channel region 28, and outwardly into the JFET region 29, connecting to one another. The illustrated body region extensions 94 generally ensure that all of the distances 60 between the well regions 18 and the body region extensions 94 of neighboring device cells 172 (e.g., between regions of neighboring device cells 172 that have the second type of conductivity) are less than or equal to the distance 49 between parallel portions of the well regions 18 of the neighboring cells 172. In other words, the body region extensions 94 generally ensure that no portion of the JFET region 29 is wider than $W_{JFET,parallel}$ 49. The body region extensions 94 of the cells 172 of FIG. 20 extend from the body region 39, through portions of the source contact region 42, through portions of the source region 20, and through two opposite corners of the channel region 28, and through the JFET region 29 to couple with (overlap with) the body region extensions 94 of neighboring cells 172.

Figure 21:
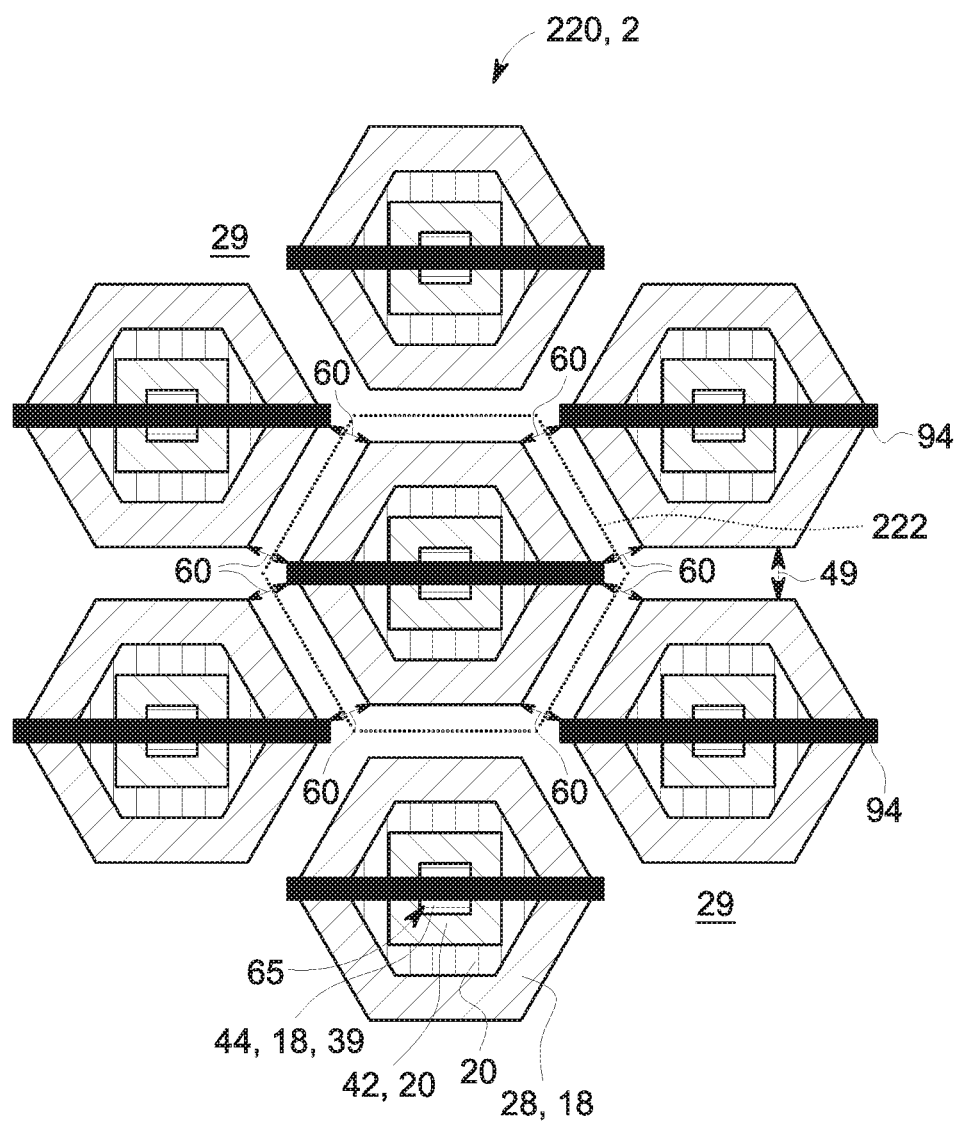
FIGS. 21-29 are top-down views of SiC layers having device layouts that include a number of hexagonal SiC device cells with different examples of body region extensions, in accordance with embodiments of the present technique.

As mentioned, the presently disclosed body region extensions may also be used with cellular devices having hexagonal shapes. For example, FIG. 21 illustrates a device layout 220 that includes a number of hexagonal device cells 222, in accordance with embodiments of the present technique. Each of the device cells 222 of FIG. 21 includes a body region extension 94 that extends from the body region 39, disposed near the center 65 of each device cell 222, through the source region 20, through the channel region 28, an outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the device cells 222 of FIG. 21 extend from the body region 39, through two opposite corners of the source region 20, through two opposite corners of the channel region 28, and into the JFET region 29. The body region extensions 94 of the cells 222 of FIG. 21 may also be described generally bisecting the device cells 222 (e.g., bisecting the body region 39, the source region 20, and/or the channel region 28 of the device cell 222).

Figure 22:
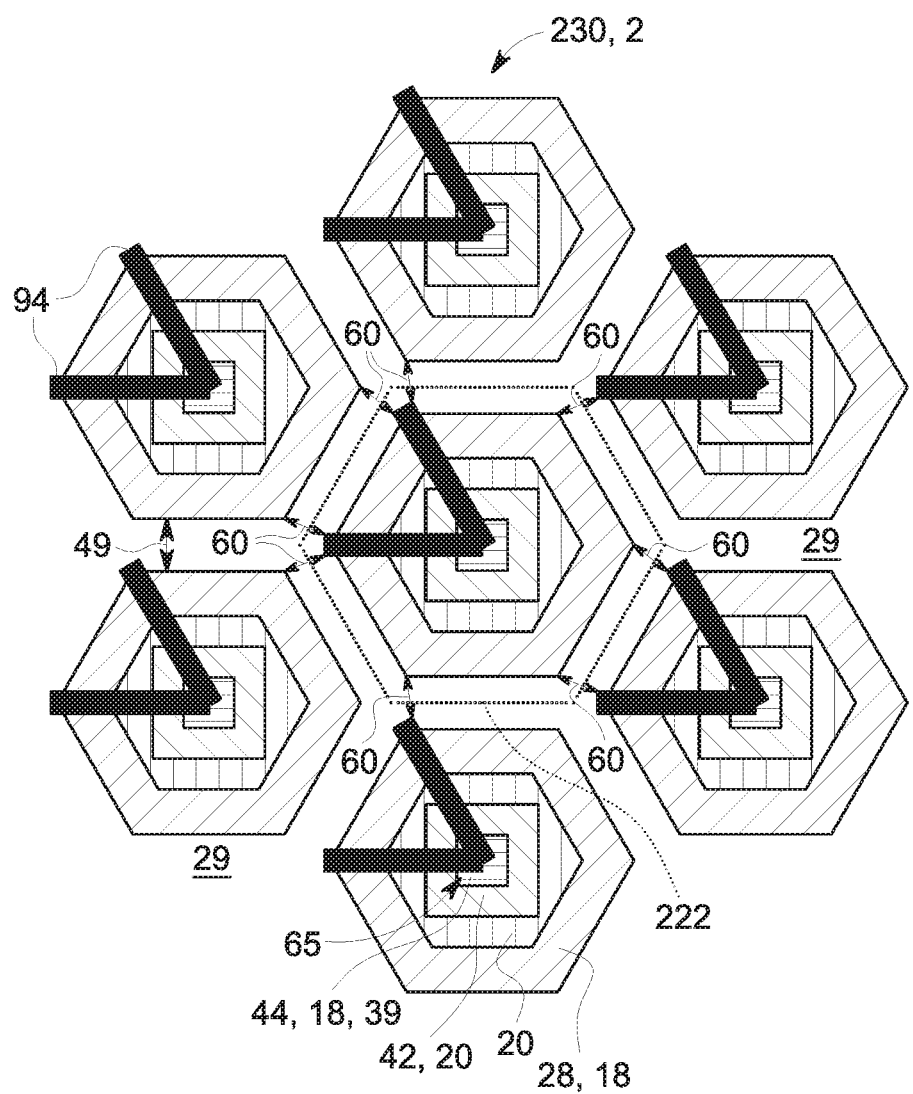

FIG. 22 illustrates a device layout 230 that includes a number of hexagonal device cells 222, in accordance with embodiments of the present technique. Each of the device cells 222 of FIG. 22 includes a body region extension 94 that extends from the body region 39, disposed near the center 65 of each device cell 222, through the source region 20, through the channel region 28, and outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the cells 222 of FIG. 22 extend from the body region 39, through a portion (e.g., a corner and an adjacent side) of the source contact region 42, through two adjacent corners of the source region 20, through two adjacent corners of the channel region 28, and into the JFET region 29.

Figure 23:
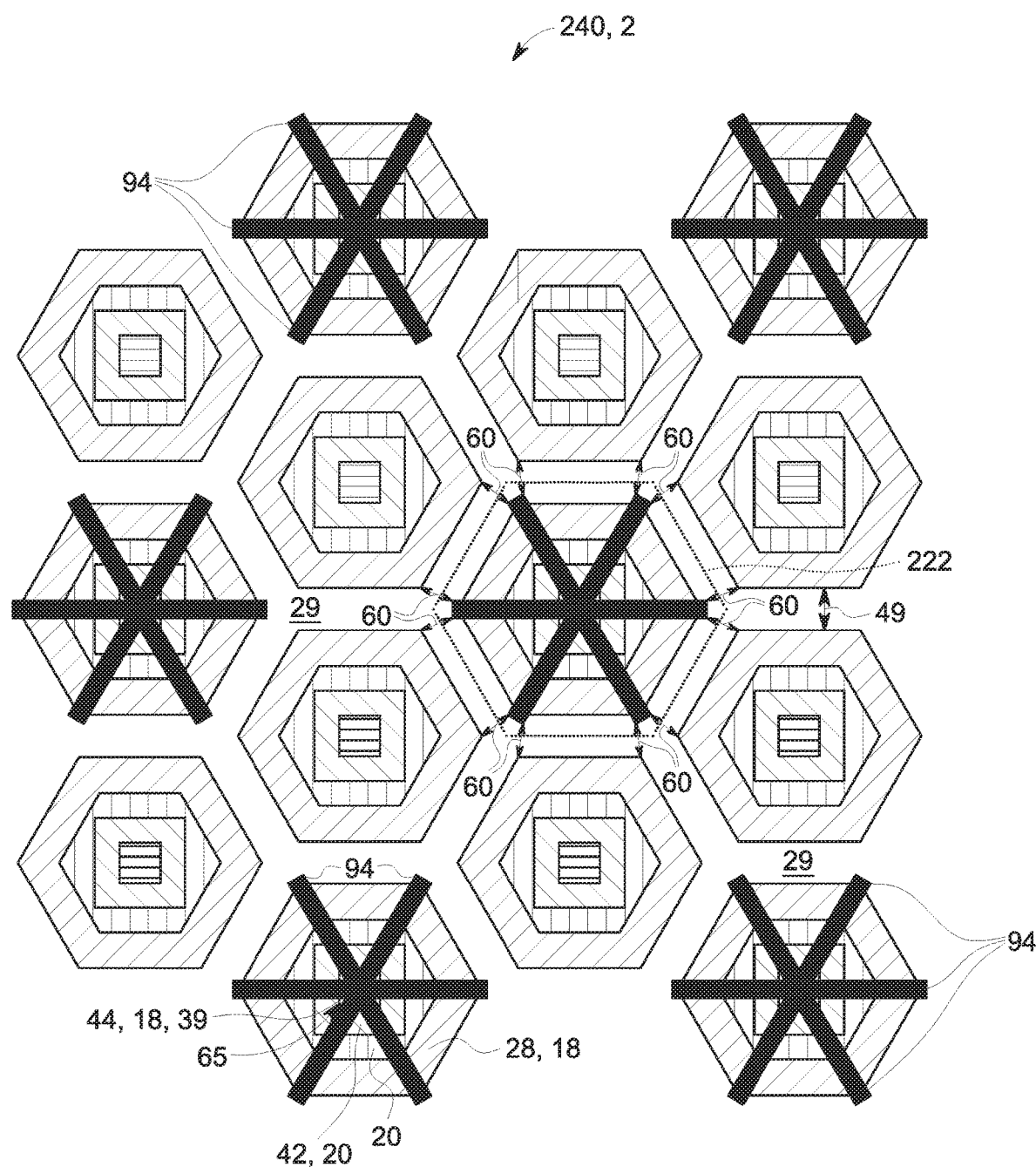

FIG. 23 illustrates a device layout 240 that includes a number of hexagonal device cells 222, in accordance with embodiments of the present technique. A portion of the hexagonal device cells 222 of FIG. 23 include a body region extension 94 that extends from the body region 39, disposed near the center 65 of each device cell 222, through the source region 20, through the channel region 28, and outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the cells 222 of FIG. 23 extend from the body region 39, through (e.g., all corners and two opposite sides of) the source contact region 42, through three sets of opposite corners (e.g., all corners) of the source region 20, and through three sets of opposite corners (e.g., all corners) of the channel region 28, and into the JFET region 29. Further, as illustrated by the layout 240 of FIG. 23, the device cells 222 that include the body region extensions 94 are separated (e.g., isolated, surrounded on six sides, surrounded on all sides) by device cells 222 that do not include the body region extensions 94 extending from their body region 39.

Figure 24:
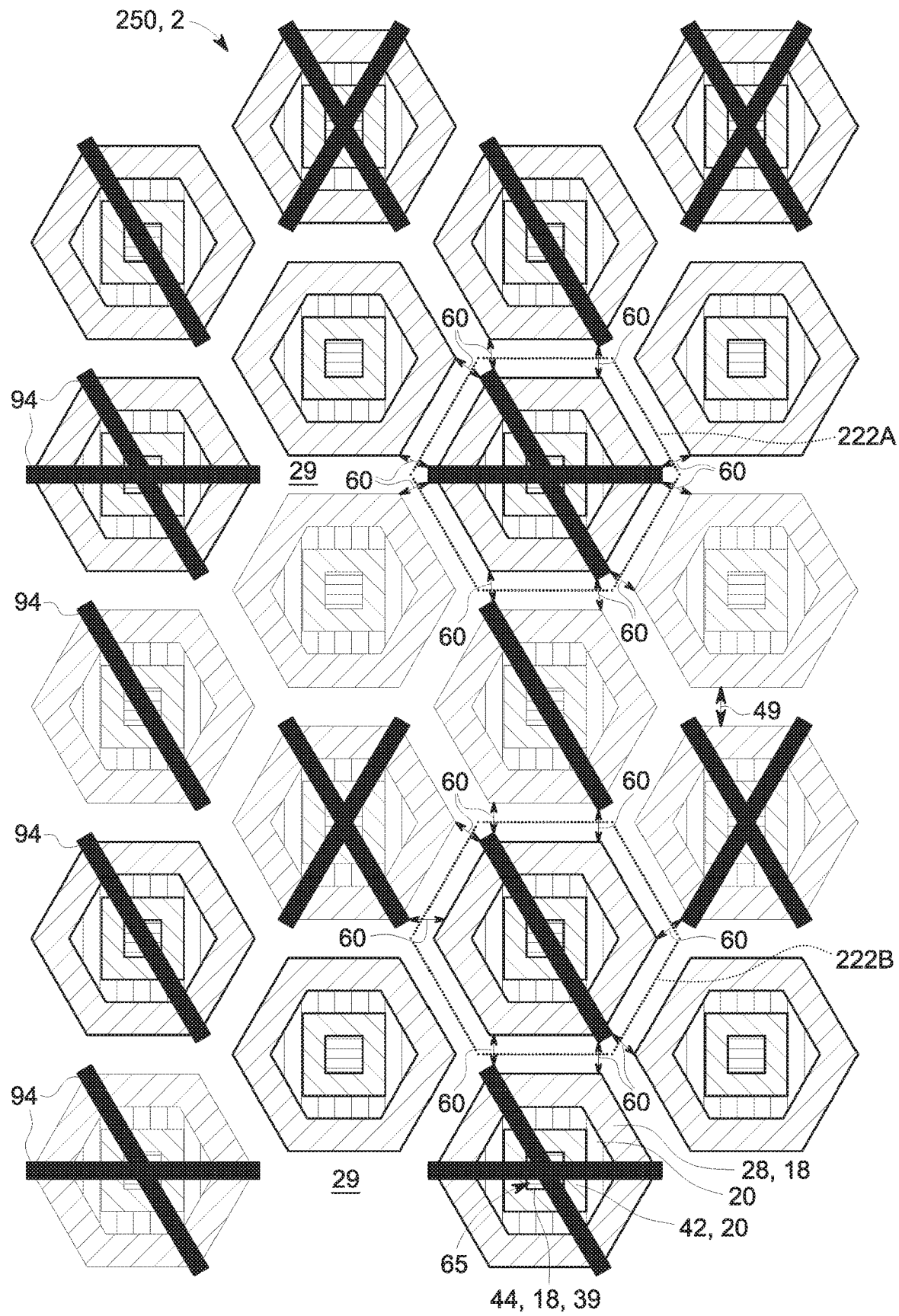

FIG. 24 illustrates a device layout 250 that includes a number of hexagonal device cells 222, in accordance with embodiments of the present technique. A portion of the hexagonal device cells 222 of FIG. 24 include a body region extension 94 that extends from the body region 39, disposed near the center 65 of each device cell 222, through the source region 20, through the channel region 28, and outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. A portion of the device cells 222A of FIG. 24 have a body region extension 94 that extends from the body region 39, through the source contact region 42, through two opposite corners of the source region 20, through two opposite corners of the channel region 28, and into the JFET region 29. Another portion of the device cells 222B of FIG. 24 have a body region extension 94 that extends from the body region 39, through the source contact region 42, through two sets of opposite corners of the source region 20, through two sets of opposite corners of the channel region 28, and into the JFET region 29. The remainder of the device cells of the layout 250 of FIG. 24 do not include body region extensions 94 extending from their body region 39; however, their JFET regions 29 are shielded by the body region extensions 94 of neighboring cells 222.

Figure 25:
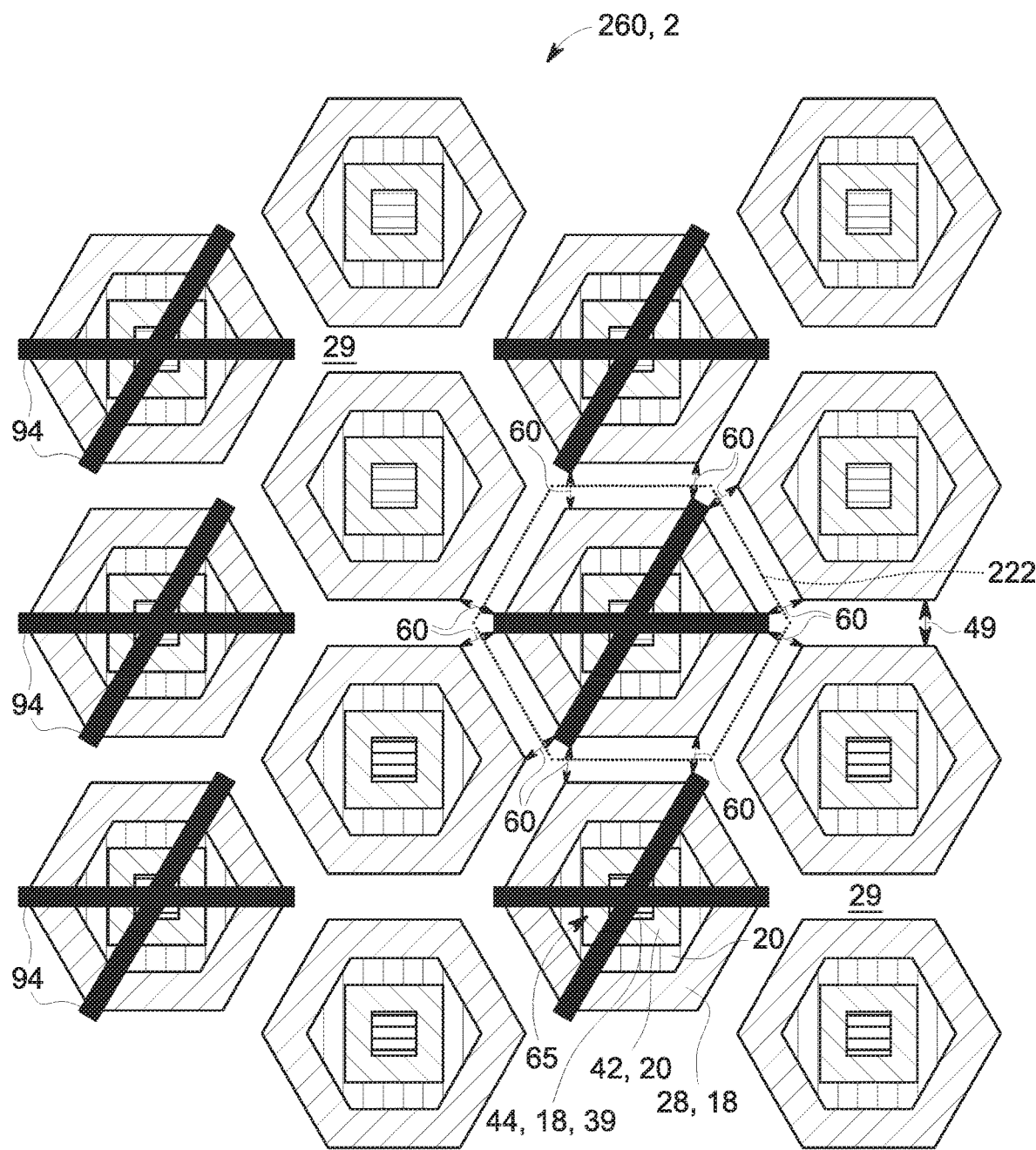

FIG. 25 illustrates a device layout 260 that includes a number of hexagonal device cells 222, in accordance with embodiments of the present technique. A portion of the hexagonal device cells 222 of FIG. 25 include a body region extension 94 that extends from the body region 39, disposed near the center 65 of each device cell 222, through the source region 20, through the channel region 28, and outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. A portion of the device cells 222 of FIG. 25 have a body region extension 94 that extends from the body region 39, through the source contact region 42, through two sets of opposite corners of the source region 20, through two sets of opposite corners of the channel region 28, and into the JFET region 29. Further, only alternating columns of device cells 222 in the layout 260 include the body region extensions 94, and JFET regions 29 of device cells 222 lacking body region extensions 94 are shielded by the body region extensions 94 of neighboring cells.

Figure 26:
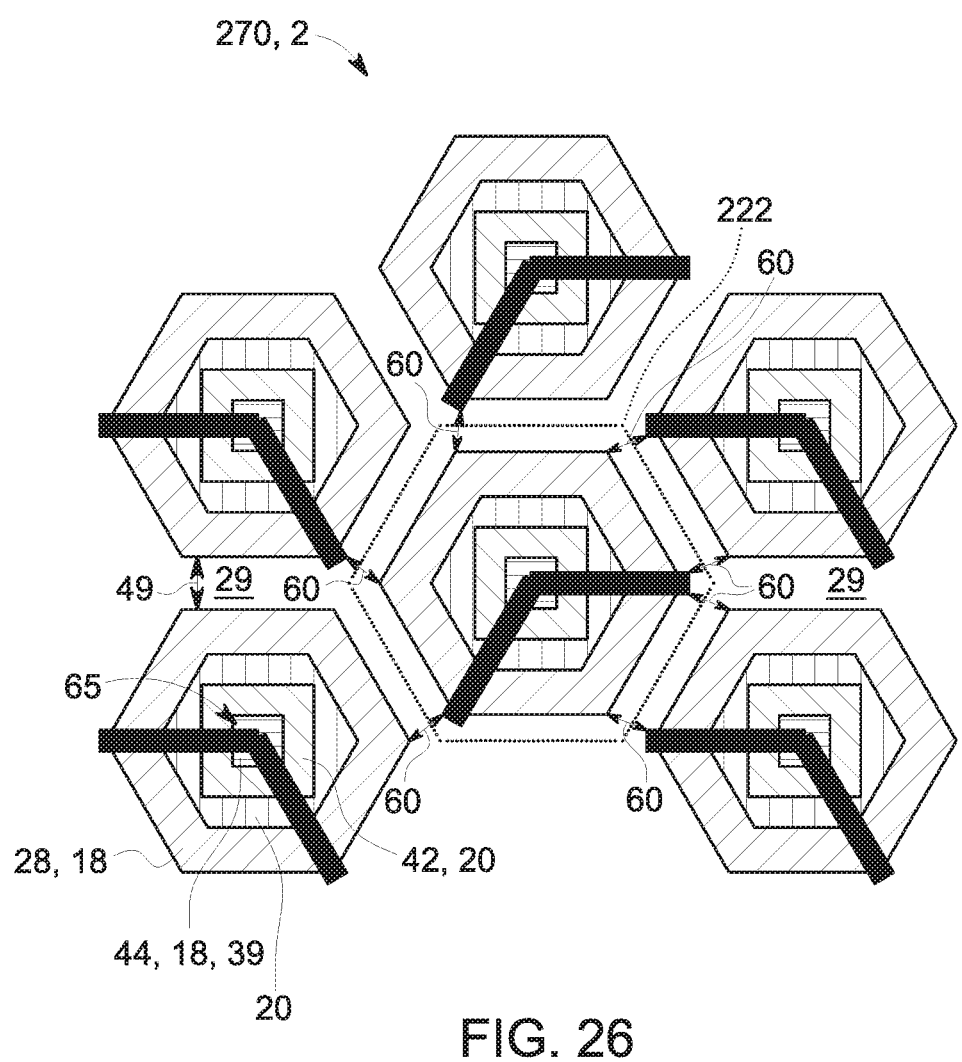

FIG. 26 illustrates a device layout 270 that includes a number of hexagonal device cells 222, in accordance with embodiments of the present technique. Each of the hexagonal device cells 222 of FIG. 26 includes a body region extension 94 that extends from the body region 39, disposed near the center 65 of each device cell 222, through the source region 20, through the channel region 28, and outwardly into the JFET region 29. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The device cells 222 of FIG. 26 include a body region extension 94 that extends from the body region 39, through (e.g., a corner and/or a side) the source contact region 42, through two (e.g., not adjacent, not opposite) corners of the source region 20, through two (e.g., non-adjacent, non-opposite) corners of the channel region 28, and into the JFET region 29.

Figure 27:
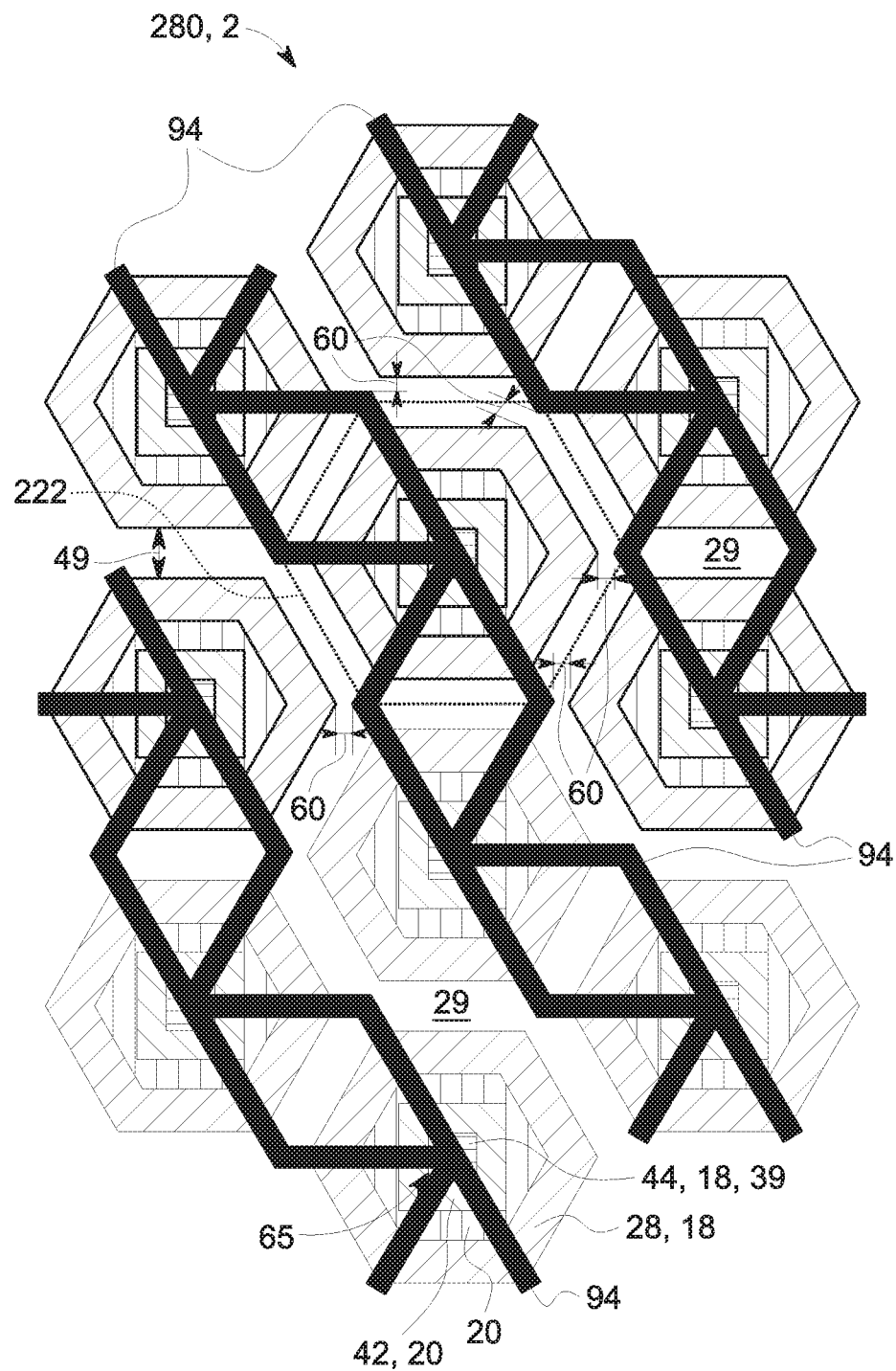

FIG. 27 illustrates a device layout 280 that includes a number of hexagonal device cells 222, in accordance with embodiments of the present technique. Each of the device cells 222 of FIG. 27 includes body region extensions 94 that extend from the body region 39, disposed near the center 65 of each device cell 222, through the source region 20, through the channel region 28, and outwardly into the JFET region 29, to connect with one another. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the cells 222 of FIG. 27 extend from the body region 39, through the source contact region 42 (e.g., corners and/or sides), through four adjacent corners of the source region 20, and through four adjacent corners of the channel region 28, and through the JFET region 29 to couple with (overlap with) the body region extensions 94 of neighboring cells 222. For the layout 280 of FIG. 27, the body region extension 94 of each cell 222 is connected to the body region extensions 94 of two neighboring device cell 222, each in two places.

Figure 28:
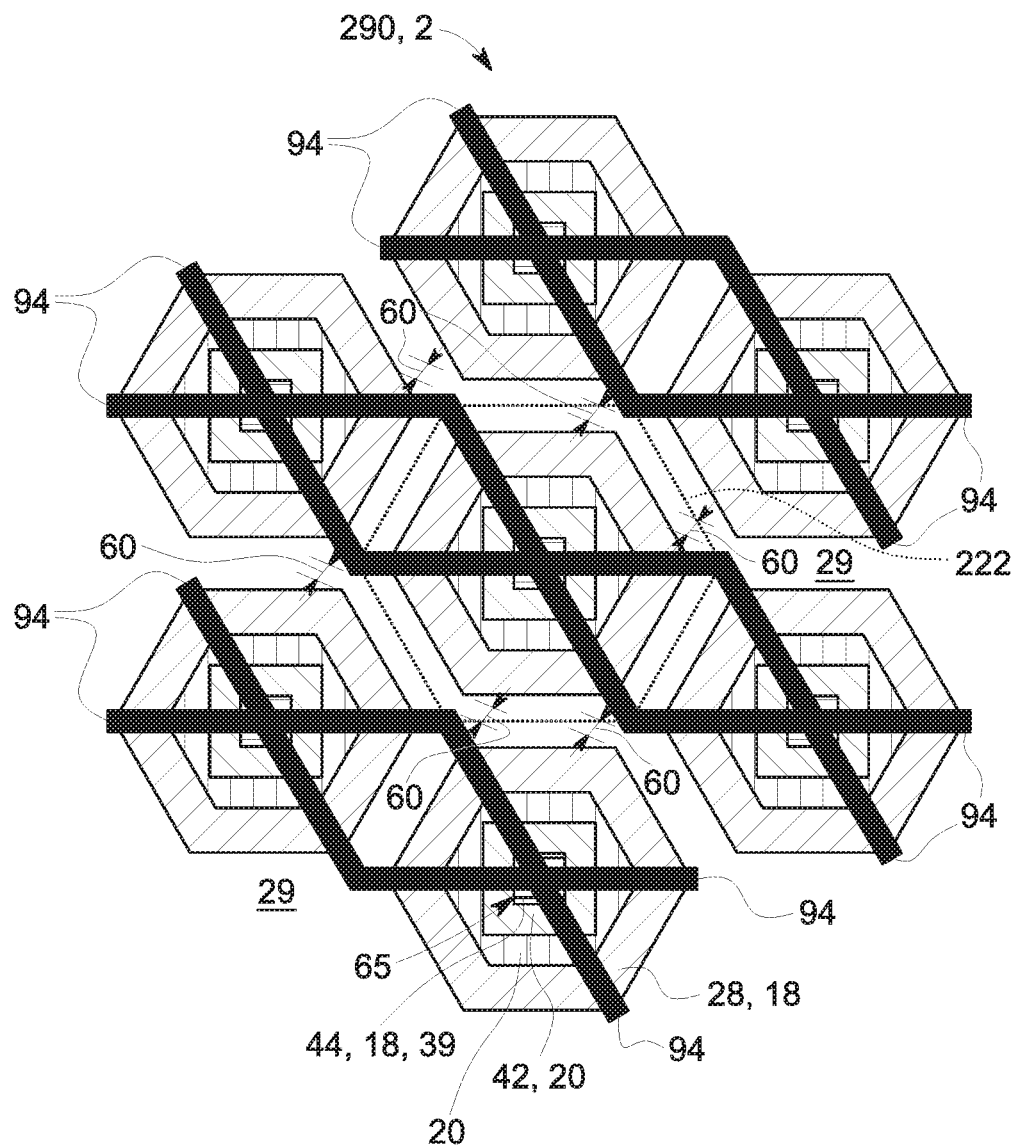

FIG. 28 illustrates a device layout 290 that includes a number of hexagonal device cells 222, in accordance with embodiments of the present technique. Each of the device cells 222 of FIG. 28 includes body region extensions 94 that extend from the body region 39, disposed near the center 65 of each device cell 222, through the source region 20, through the channel region 28, and outwardly into the JFET region 29, to connect with one another. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the cells 222 of FIG. 28 extend from the body region 39, through the source contact region 42 (e.g., corners and/or sides), through two sets of opposite corners of the source region 20, through two sets of opposite corners of the channel region 28, and through the JFET region 29 to connect with the body region extensions 94 of neighboring cells 222. For the layout 290 of FIG. 28, the body region extension 94 of each cell 222 is connected to the body region extensions 94 of two neighboring device cell 222, each in two places.

Figure 29:
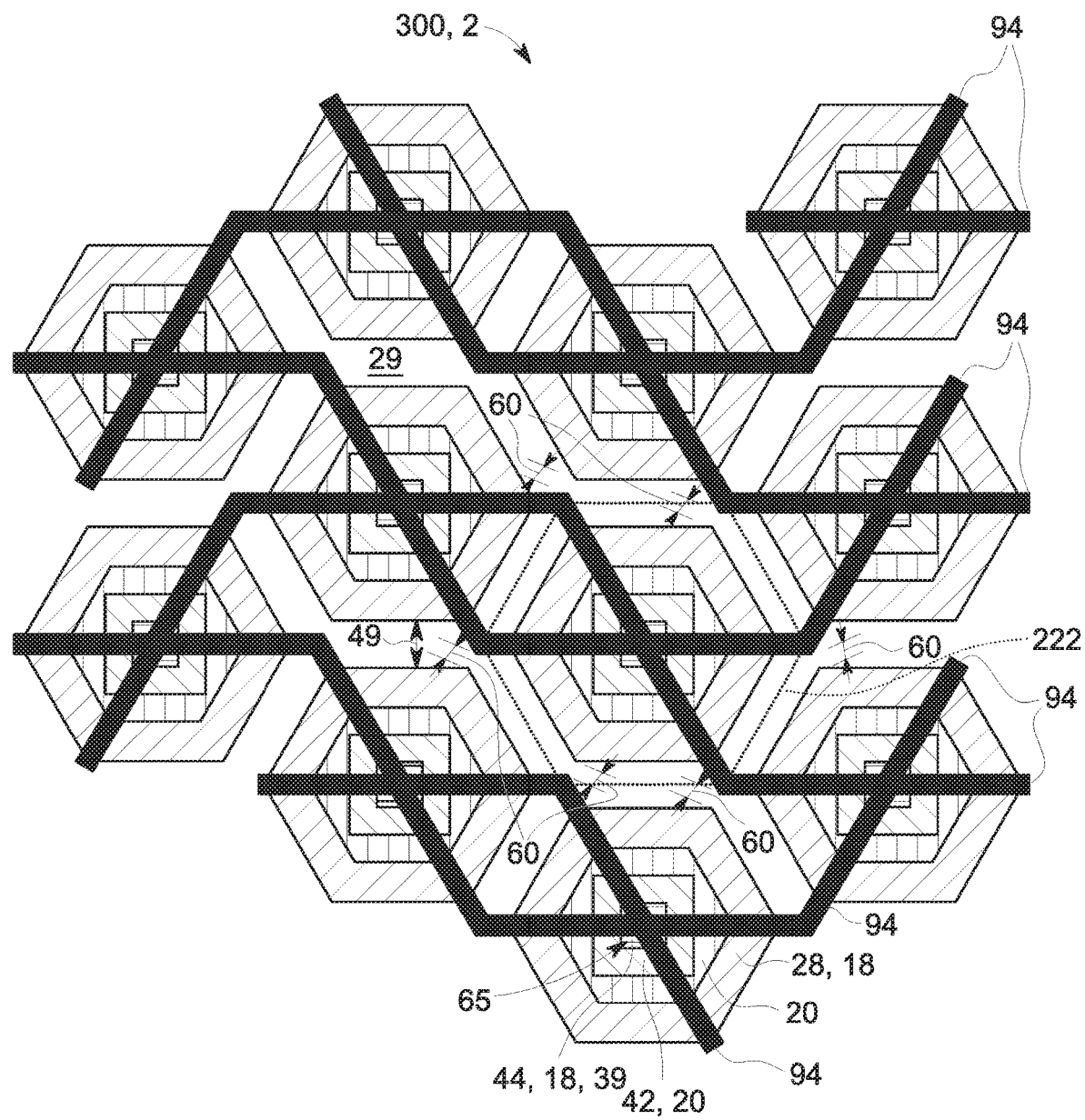

FIG. 29 illustrates a device layout 300 that includes a number of hexagonal device cells 222, in accordance with embodiments of the present technique. Each of the device cells 222 of FIG. 29 includes body region extensions 94 that extend from the body region 39, disposed near the center 65 of each device cell 222, through the source region 20, through the channel region 28, and outwardly into the JFET region 29, to connect with one another. The illustrated body region extensions 94 generally ensure that all of the distances 60 between the well regions 18 and the body region extensions 94 of neighboring device cells 222 (e.g., between regions of neighboring device cells 222 that have the second type of conductivity) are less than or equal to the distance 49 between parallel portions of the well regions 18 of the neighboring cells 222. In other words, the body region extensions 94 generally ensure that no portion of the JFET region 29 is wider than $W_{JFET,parallel}$ 49. The body region extensions 94 of the cells 222 of FIG. 29 extend from the body region 39, through the source contact region 42 (e.g., corners and/or sides), through two sets of opposite corners of the source region 20, through two sets of opposite corners of the channel region 28, and through the JFET region 29 to couple with (overlap with) the body region extensions 94 of neighboring cells 222. For the layout 300 of FIG. 29, the body region extension 94 of each cell 222 is connected to the body region extensions 94 of three neighboring device cell 222 either by one or by two connections.

FIG. 30 illustrates a device layout 310 that includes a number of elongated hexagonal device cells 312, in accordance with embodiments of the present technique. Each of the elongated hexagonal device cells 312 of FIG. 30 includes a body region extension 94 that extends from the body region 39, disposed near the center 65 of each device cell 312, through the source region 20, through the channel region 28, and outwardly into the JFET region 29. The illustrated body region extensions 94 generally ensure that all of the distances 60 between the well regions 18 and the body region extensions 94 of neighboring device cells 312 (e.g., between regions of neighboring device cells 312 that have the second type of conductivity) are less than or equal to the distance 49 between parallel portions of the well regions 18 of the neighboring cells 312. In other words, the body region extensions 94 generally ensure that no portion of the JFET region 29 is wider than $W_{JFET,parallel}$ 49. The device cells 312 of FIG. 26 include a body region extension 94 that extends from the body region 39, through portions of the source contact region 42, through a portion (e.g. two adjacent corners) of the source region 20, through two adjacent corners of the channel region 28, and into the JFET region 29.

FIG. 31 illustrates a device layout 320 that includes a number of elongated hexagonal device cells 312, in accordance with embodiments of the present technique. Each of the elongated hexagonal device cells 312 of FIG. 31 includes a body region extension 94 that extends from the body region 39, disposed near the center 65 of each device cell 312, through the source region 20, through the channel region 28, and outwardly into the JFET region 29. The illustrated body region extensions 94 generally ensure that all of the distances 60 between the well regions 18 and the body region extensions 94 of neighboring device cells 312 (e.g., between regions of neighboring device cells 312 that have the second type of conductivity) are less than or equal to the distance 49 between parallel portions of the well regions 18 of the neighboring cells 312. In other words, the body region extensions 94 generally ensure that no portion of the JFET region 29 is wider than $W_{JFET,parallel}$ 49. The device cells 312 of FIG. 26 include a body region extension 94 that extends from the body region 39, through portions of the source contact region 42, through two opposite corners of the source region 20, through two opposite corners of the channel region 28, and into the JFET region 29.

Technical effects of the present disclosure include cellular device designs that incorporate one or more shielding regions, in the form of body region extensions, that reduce the electric field in the JFET regions, between the well regions of device cells, without significantly increasing $R_{ds}$(on). The disclosed body region extensions are designed to make the distance between regions having the second type of conductivity (e.g., corners of well regions and body region extensions) less than or equal to the distance between parallel portions of the well regions of neighboring cells, while maintaining a channel region width and/or a JFET region density that is greater than or equal to that of a conventional stripe device of comparable dimensions. Accordingly, the presently disclosed shielded device cells provide superior performance relative to a conventional stripe device of comparable dimensions, while still providing similar reliability (e.g., long-term, high-temperature stability). Furthermore, the body region extensions of the presently disclosed cellular designs may be implanted along with other features of the device cells, and as such, do not increase the complexity or cost of fabrication.

The invention claimed is:

1. A device, comprising:
a plurality of device cells at least partially disposed in a semiconductor device layer, wherein each device cell of the plurality comprises:
a body region disposed near the center of the device cell;
a source region disposed adjacent to the body region of the device cell;
a channel region disposed adjacent to the source region of the device cell; and
a JFET region disposed adjacent the channel region of the device cell, wherein the JFET region has a parallel JFET width between the channel region of the device cell and a portion of a channel region of a neighboring device cell of the plurality of device cells,
wherein at least one device cell of the plurality of device cells comprises a body region extension that extends outwardly from the body region of the at least one device cell into the JFET region such that a distance between the body region extension of the at least one device cell and a region of the neighboring device cell, having a shared conductivity-type as the body region extension, is less than or equal to the parallel JFET width.

2. The device of claim 1, wherein the semiconductor device layer is a silicon carbide (SiC) semiconductor device layer.

3. The device of claim 1, wherein the distance between the body region extension of the at least one device cell and the region of the neighboring device cell is less than the parallel JFET width.

4. The device of claim 1, comprising an ohmic contact disposed over at least a portion of the body region extension of the at least one device cell.

5. The device of claim 1, wherein a width of the body region extension of the at least one device cell varies across a length of the body region extension.

6. The device of claim 1, wherein each of the plurality of device cells has a substantially square shape.

7. The device of claim 1, wherein each of the plurality of device cells has a hexagonal shape.

8. The device of claim 1, wherein each of the plurality of device cells has an elongated rectangular shape.

9. The device of claim 1, wherein each of the plurality of device cells has an elongated hexagonal shape.

10. The device of claim 1, wherein the at least one device cell of the plurality of device cells comprises two or more device cells, wherein each device cell of the two or more device cells comprises the body region extension, and wherein the body region extension extends outwardly from the body region of each device cell, through two or more corners of the source region of each device cell, through two or more corners of the channel region of each device cell, and into the JFET region.

11. The device of claim 1, wherein the at least one device cell comprises two or more device cells of the plurality of device cells, and each body region extension of the two or more device cells extend towards and connect to each other.

12. The device of claim 1, wherein the at least one device cell comprises two or more device cells of the plurality of device cells, and each body region extension of the two or more device cells are oriented in substantially the same direction.

13. The device of claim 1, wherein the at least one device cell comprises two or more device cells of the plurality of device cells, and each body region extension of the two or more device cells are oriented in different directions.

14. The device of claim 1, wherein the body region extension of the at least one device cell does not extend through all corners of the channel region of the at least one device cell.

15. A device, comprising:
a plurality of device cells at least partially disposed in a semiconductor device layer, wherein each device cell of the plurality comprises:
  a body region disposed near the center of the device cell;
  a source region disposed adjacent to the body region of the device cell;
  a channel region disposed adjacent to the source region of the device cell; and
  a JFET region disposed adjacent the channel region of the device cell, wherein the JFET region has a parallel JFET width between the channel region of the device cell and a portion of a channel region of a neighboring device cell of the plurality of device cells,
wherein at least two device cells of the plurality of device cells comprises a body region extension that extends outwardly from the body region of each respective device cell of the at least two device cells, through two or more corners of the source region of each respective device cell of the at least two device cells, through two or more corners of the channel region of each respective device cell of the at least two device cells, and into the JFET region such that a distance between each body region extension of the at least two device cells and a region of the neighboring device cell is less than or equal to the parallel JFET width.

16. The device of claim 15, wherein the two or more corners of the source region are opposite corners of the source region, and the two or more corners of the channel region are opposite corners of the channel region.

17. The device of claim 15, wherein the two or more corners of the source region are adjacent corners of the source region, and the two or more corners of the channel region are adjacent corners of the channel region.

18. The device of claim 15, wherein one or more device cells of the plurality of device cells disposed adjacent to the at least two device cells do not include respective body region extensions, and wherein the one or more device cells are shielded by the body region extension of the at least two device cells.

19. The device of claim 15, wherein each body region extension is a body contact region extension having an ohmic contact disposed thereon.

20. The device of claim 15, wherein the at least two device cells are in a first column of the plurality of device cells and the neighboring device cell is in a second column of the plurality of device cells that lack respective body region extensions.

* * * * *